US005273588A

United States Patent [19]
Foster et al.

[11] Patent Number: 5,273,588
[45] Date of Patent: Dec. 28, 1993

[54] SEMICONDUCTOR WAFER PROCESSING CVD REACTOR APPARATUS COMPRISING CONTOURED ELECTRODE GAS DIRECTING MEANS

[75] Inventors: Robert F. Foster, Weston, Mass.; Helen E. Rebenne, Fair Lawn, N.J.; Rene E. LeBlanc, Branford, Conn.; Carl L. White, Gilbert; Rikhit Arora, Mesa, both of Ariz.

[73] Assignee: Materials Research Corporation, Orangeburg, N.Y.

[21] Appl. No.: 898,560

[22] Filed: Jun. 15, 1992

[51] Int. Cl.[5] ............................................. C23C 16/50
[52] U.S. Cl. ................................. 118/723 E; 118/715; 156/345
[58] Field of Search ............... 118/723, 715, 724, 725; 156/345

[56] References Cited
U.S. PATENT DOCUMENTS

| | | | |
|---|---|---|---|
| 4,340,462 | 7/1982 | Koch | 156/345 X |
| 4,629,635 | 12/1986 | Brors | 156/643 |
| 4,976,996 | 12/1990 | Monkowski et al. | 118/725 X |
| 5,006,192 | 4/1991 | Deguchi | 156/345 |

OTHER PUBLICATIONS

Spectrum CVD, Inc. Product Specification Model 202, Brochure, 1990.
Spectrum Model 211 CVD System, Spectrum CVD, Inc., Brochure.

Primary Examiner—Brian E. Hearn
Assistant Examiner—Jonathan D. Baskin
Attorney, Agent, or Firm—Donald F. Frei; Joseph R. Jordan

[57] ABSTRACT

A semiconductor wafer processing apparatus, particularly a CVD reactor, is provided with plasma cleaning electrodes integrated into process gas flow shaping structure that smoothly directs the gas past the wafer on a susceptor. The processing apparatus preferably has a showerhead or other inlet to direct a gas mixture onto a wafer and a plurality of baffles to reduce turbulence. Plasma cleaning electrodes are included in the baffles or the showerhead or both, one or more of which preferably have cleaning gas outlet orifices therein, preferably evenly distributed around the axis of the susceptor to provide uniform cleaning gas flow.

9 Claims, 13 Drawing Sheets

SEMICONDUCTOR WAFER PROCESSING CVD REACTOR APPARATUS COMPRISING CONTOURED ELECTRODE GAS DIRECTING MEANS

This application is related to commonly assigned and copending U.S. applications Ser. Nos. 07/898,826 entitled ROTATING SUSCEPTOR SEMICONDUCTOR WAFER PROCESSING CLUSTER TOOL MODULE USEFUL FOR TUNGSTEN CVD, and 07/898,800 entitled SEMICONDUCTOR WAFER PROCESSING METHOD AND APPARATUS WITH HEAT AND GAS FLOW CONTROL, both filed on Jul. 15, 1991 by the inventors hereto.

The present invention relates to chemical vapor deposition (CVD) reactors for the processing of semiconductor wafers, and particularly to CVD reactor modules for semiconductor wafer processing cluster tools. More particularly, the present invention is applicable to the CVD of coating materials such as tungsten, titanium nitride and other metal and dielectric substances onto silicon semiconductor wafers, and to other silicon processes in which mass transport is a present but not controlling characteristic of the process.

BACKGROUND OF THE INVENTION

In the manufacture of semiconductor wafers and of other similarly manufactured articles, sequences of processes including coating, etching, heat treating and patterning are sequentially employed. Most of these processes involve the chemical or physical addition or removal of material to or from a surface of a substrate, usually transported as a vapor.

Certain coating processes in such sequences are performed by chemical vapor deposition (CVD). CVD is preferred, for example, in applying films to the differently facing surfaces of holes through underlying layers, as, for example, to apply conductive films for the purpose of making interconnections across insulating layers and the like.

The ultimate result of CVD processes for filling holes or vias, and for forming interconnections between layers on semiconductor wafers, is frequently the selective deposition of the film, that is, formation of a permanent film on only selected portions of the wafer surfaces. Direct selective application by CVD of such coatings is often unreliable, unsuccessful, or slow, and thus undesirable on a commercial scale, where rapid throughput and efficient use of expensive machinery is important. Therefore, selective end product films are often applied in blanket fashion and then etched back from the areas where permanent film is undesired.

Blanket CVD of materials, such as tungsten, followed by an etching back of the deposited material, requires a high degree of uniformity in the blanket film, particularly on the areas of a substrate from which the material is to be etched. If the coating is irregular in the etchback areas, the etching process may selectively damage the underlying layers in regions of the wafer where the blanket film to be etched is thin, or may result in regions where residual film remains. CVD reactors of the prior art have coated substrates with limited uniformity, or at limited speed. Accordingly, more uniform application of the films and higher speed CVD reactors, particularly for blanket coating applications of materials such as tungsten, are required.

To uniformly apply films such as tungsten by CVD to semiconductor wafers, it is desirable to ensure a uniform supply of reactant gases across the surfaces of the wafers, and to uniformly remove spent gases and reaction byproducts from the surfaces being coated. In this respect, prior art CVD reactors perform with limited success. Similarly, in other processes such as physical and chemical etching and heat treating processes, including preheating and annealing processes, prior art systems have been inadequate in uniformly bringing vapors into contact with, and removing them from, the surface being processed. Accordingly, there is a need to more efficiently and more uniformly supply and remove reaction and other gases to and from the surfaces of wafers being processed, and particularly those being coated by CVD processes.

Efficient commercial production of semiconductor wafers requires that the processing equipment function as continuously as possible. When deposits form on interior components of processing chambers, such as those of CVD reactors, they become ineffective and their use must be suspended for cleaning. Many reactors of the prior art require cleaning at an undesirable frequency, or are too difficult and too slow to clean, thus resulting in excessive reactor downtime. Accordingly, there is a continuing need for processing chambers such as those of CVD reactors that require less frequent cleaning of components, that reduce unwanted deposition on components, and that can be cleaned more rapidly.

In the chambers of CVD reactors and other wafer processors of the prior art, turbulence in the flow of reaction gases has inhibited the efficiency and uniformity of the coating process and has aggravated the deposition and migration of contaminants within the reaction chamber. Accordingly, there is a need for improved gas flow, and reduced gas flow turbulence, within such chambers.

CVD processes such as those for the application of tungsten coatings to semiconductor wafers are typically performed in cold wall reactors, where the wafers to be coated are heated to a reaction temperature on a susceptor while other surfaces of the reactor are maintained at subreaction temperatures to prevent the deposition of films thereon. For tungsten CVD, for example, reactor walls are often cooled, often to about room temperature. Alternatively, for titanium nitride (TiN) CVD, the walls may be heated above room temperature, but to a temperature below that of the substrate being treated. In such cases, there is a need in the designs of such wafer processing devices that have components that are maintained at different temperatures to prevent heat from flowing between the wafer or susceptor and other components of the apparatus.

In tungsten CVD processes, tungsten hexafluoride gas ($WF_6$) is commonly employed. This $WF_6$ gas is costly, as are the gases employed in many other wafer treating processes. When the gas utilization efficiency is low, as is the case of many reactors of the prior art, the cost of the gas can be high. With many tungsten CVD reactors, the utilization efficiency of $WF_6$ is below twenty percent, and the cost of the $WF_6$ often exceeds thirty percent of the entire cost of the performance of the process for application of the tungsten film. Accordingly, CVD reactors that are more efficient in the consumption of reactant gases such as $WF_6$ are required.

CVD processes may be divided into two categories, those that are mass transport controlled and those that are surface condition or temperature controlled. Mass transport controlled processes are typically those involving the CVD of group III-V materials onto substrates such as gallium arsenide wafers or for the epitaxial growth of silicon. Such processes are controlled by the transport of gases to and from the wafer surfaces and have been used by moving the wafers, typically mounted in pluralities on rotating or otherwise moving susceptors that cause the substrates to orbit about an axis in a flowing gas, or otherwise employing techniques to enhance and control the gas flow across the wafers. Typically, the mass transport controlled CVD processes will be found on an Arrhenius plot, that is a plot of the log of the deposition rate versus the reciprocal of the temperature, above the knee in the curve.

Wafer temperature or surface condition controlled CVD processes are typically found below the knee of the Arrhenius plot curve. These are brought about by lower temperatures, and usually at lower pressures of from 1 to 100 Torr. Generally, such processes are not regarded in the prior art as amenable to enhancement by wafer movement, except to achieve temperature or reaction uniformity, which is promoted with low speed movement.

SUMMARY OF THE INVENTION

It has been a primary objective of the present invention to provide an efficient and productive apparatus for the thin film processing of articles such as semiconductor wafers. It is a more particular objective of the present invention to provide such an apparatus primarily useful for the chemical vapor deposition of films onto semiconductor wafers, as, for example, the blanket or selective deposition of, for example, tungsten, titanium nitride and similarly materials deposited by CVD processes onto silicon semiconductor wafers.

It has been a further objective of the present invention to provide in such a processing apparatus, such as a CVD apparatus for uniformly applying film to semiconductor wafers, such as for applying blanket films of tungsten, other metal and dielectric material, by CVD processes, and other silicon processes that are primarily surface temperature controlled and dependent, that is effective in enhancing the rate and quality of the effective in enhancing the rate and quality of the wafer coating or other processed surface, whether planar or, more importantly non-planar or patterned.

It has been another objective of the present invention to provide a sealed chamber processing apparatus, such as a cold wall CVD reactor, having minimal heat flow from the heated wafer or susceptor to other components of the apparatus that should remain cooler.

It has been a further objective of the present invention to provide a processing apparatus requiring less downtime for cleaning, having a resistance to the buildup of unwanted deposits within and to the propagation of contaminants therethrough, and that is efficiently cleaned.

It is a particular objective of the present invention to enhance the uniformity of the application of coating in a CVD processing apparatus, to maintain clean internal surfaces, and to thermally isolate the heated wafer or susceptor, by reducing the turbulent flow of gases within the reactor.

Further objectives of the present invention include providing for inert gas flow within the reactor to facilitate the holding of the wafer to the susceptor, to enhance the conduction of heat between the wafer and the susceptor, to protect internal components of the reactor from undesired deposits and contamination, and to assist the non-turbulent flow of reactant gases through the reactor.

It is a further objective of the present invention to provide a CVD reactor which will easily accommodate wafers of differing sizes for coating and accommodate different coating processes.

It has been a particular objective of the present invention to provide a processor and module for a wafer processing cluster tool or stand-alone processor utilizing a single wafer rotating susceptor, and particularly one for the chemical vapor deposition of films, such as blanket films, of materials such as tungsten, titanium nitride, and other such films amenable to such processes, and alternatively for the selective deposition of such materials.

According to the principles of the present invention, there is provided a CVD processing apparatus with a reactor having a single wafer rotating susceptor on which a wafer is maintained at a processing temperature, and having a reactor wall maintained at a different temperature. In reactors for the application of films such as tungsten, the walls are cooled to approximately room temperature while in those for the application of titanium nitride films, the walls are heated to above room temperature but to below the optimum processing temperature of the susceptor.

The preferred embodiment of the present invention provides a CVD module for a wafer processing cluster tool having a rotating wafer holding susceptor that rotates on a vertical axis, is preferably upwardly facing, and has a flow of reactant gas directed from a showerhead, preferably downwardly, toward and perpendicular to the wafer, with the susceptor rotating sufficiently fast to cause a thin boundary layer to form above the wafer surface, across which the gases that interact with the wafer surface diffuse. In the CVD reactor, reactant gases flow radially outwardly from a stagnation point at the wafer center on the axis of rotation.

In the preferred embodiment of the invention, gases are caused to flow with minimum turbulence from a downwardly facing showerhead at the top of the chamber, downwardly against the upwardly facing wafer surface, radially outwardly across the wafer surface, over a wafer encircling ring or lip, downwardly along the susceptor sidewall, through annular openings defined by baffles, and then out a single vacuum exhaust port in the end or bottom of the chamber opposite the showerhead. In CVD applications, plasma cleaning electrodes are provided and are combined with structure shaped to facilitate non-turbulent gas flow. The walls of the susceptor have finishes and cross-sections that retard the flow of heat from the heated components to the cooled components of the reactor.

In one alternative embodiment of the invention, an inert gas is introduced at points around the wafer, the wafer support and the susceptor rotating structure to inhibit contamination thereof by particles and reactant gas and to facilitate the smooth flow of the gases through the chamber across junctures of the susceptor components. In other embodiments, inert gas is employed for retention of the wafer, by relative vacuum, to the susceptor, and to enhance heat conduction between the susceptor and the wafer. In embodiments where inert gas is introduced around the rim of the wafer and for vacuum clamping of the wafer to the susceptor, the inert gases are introduced from separate supplies, with the rim gas introduced at or above the processing chamber pressure and the vacuum clamping gas introduced at a lower pressure.

In accordance with the preferred and illustrated embodiment of the present invention, there is provided a CVD reactor having an upwardly facing rotary susceptor spaced below a horizontally disposed, downwardly directed reactant gas distributing showerhead that separates a gas mixing chamber from a reaction chamber that encloses the susceptor. The mixing chamber, located at the top of the reaction chamber, is maintained at a relatively low, sub-reaction temperature, along with the walls of the reaction chamber. In tungsten deposition applications, the mixing chamber and the reaction chamber walls are cooled to approximately room temperature, either with ethylene glycol, water or some other suitable fluid, while in titanium nitride deposition applications, these are heated to a temperature between room temperature and the reaction temperature of the susceptor.

During a deposition reaction, the susceptor is rotated. For 150 millimeter wafers in a tungsten deposition process, with reaction pressures at about 50 Torr, the susceptor is rotated at least at 200 RPM, preferably at not more than 2000 RPM, and most preferably in the range of from 500 to 1500 RPM. The rotation results in a stagnation point at the center of the wafer and minimizes the thickness of the boundary layer immediately above the surface of the wafer, enabling the process gas to reach the wafer faster and the by-products from the process to escape from the upper surface of the wafer. As such, these features present advantages not only in deposition processes such as CVD, but in etching processes and other processes where gases must efficiently be brought into contact with the wafer surface or efficiently removed from the surface, such as annealing and degassing processes and other heat treating processes.

In the preferred and illustrated embodiment, the susceptor is heated to approximately 400°–550° C., preferably 450° C., and heat from the heated susceptor is prevented from significantly heating the rotary shaft on which the susceptor is supported by its mounting and its fabrication. Highly reflective surfaces on all elements inside the rotating susceptor minimize heat transfer between the heated wafer support of the susceptor and the drive assembly. In addition, a dull surface finish is provided on the exterior of the rotating susceptor to maximize radiation of heat away from the susceptor toward the chamber walls where the walls are cooled, and to minimize absorption of heat from the chamber walls where the chamber walls are heated. Extremely thin susceptor walls further minimize heat transfer between the heated wafer support and the drive assembly.

The chamber walls are also thermally isolated from the drive assembly. A susceptor mounting disc connects an annular flange on the susceptor base with the top of the susceptor drive shaft, and is provided with projecting support structure to present a minimum contact surface to act as a thermal block to further reduce heat transfer between the heated wafer support and the drive assembly.

The reactant gas is caused to flow from the showerhead with minimum turbulence, downward to a single exhaust outlet in the bottom of the reaction chamber. Multiple baffles at the bottom region of the chamber encircle the susceptor shaft and provide annular gas flow openings around the shaft to present progressively decreasing cross-sectional area to the gas flow, thus providing a pressure gradient that facilitates exhausting gas uniformly through the single port in the chamber floor without creating turbulence inside the chamber. The exterior shape or envelope of the rotating susceptor is smoothly contoured to further minimize turbulence. An annular lip is provided around the wafer on the upper surface of the heated wafer support, and is closely spaced to the circular edge of the wafer and flush with the upper surface thereof to further minimize turbulence and to also eliminate radial thermal gradients in the wafer in the edge region thereof. The wafer-encircling lip is a separate annular element which can be readily removed and substituted with a different one having a different internal diameter to accommodate wafers of different sizes. Rounded corners on the upper circular edge of the annular lip element further minimize turbulence. This lip element has a substantial upwardly facing annular surface to serve as a scavenger for unused tungsten hexafluoride gas or other reactant gas, thereby minimizing the amount of reactant gas which has to be scrubbed from the exhaust.

In this preferred embodiment, a pair of annular electrodes are provided, one at the top of the chamber and one at the bottom of the chamber, for plasma cleaning of the reactor. Each of these electrodes is provided with openings for injection into the chamber of $NF_3$ gas, in the case of tungsten deposition, or some other cleaning gas appropriate to the process. The openings are disposed in circular arrays in the upper and lower electrodes to facilitate plasma cleaning of the interior components of the chamber. The upper electrode has a conical inner surface with an angulation from the diameter of the showerhead toward the reaction chamber wall, which also contributes to the minimization of turbulence. The lower electrode is incorporated into the uppermost one of the baffles.

Further in accordance with one alternative embodiment of the invention, nitrogen gas passages above and below a vacuum passage, all of which passages encircle the drive-shaft in the base of the chamber, reduce reactant gas and particulate contamination of the bearings and other shaft supporting and moving structure. This feature is preferred where it is desirable to extend the service life of the bearing and increase the time required between servicing.

In embodiments where vacuum holding of the wafer to the susceptor is employed, helium leakage paths are provided around wafer lifting pins on the susceptor surface, which facilitates vacuum gripping of the wafer when the pressure in the rotating susceptor interior is maintained below the pressure of the CVD chamber. Further, helium gas below the wafer between the back of the wafer and the upper surface of the heated wafer support, which, unless the pressure thereof is too low, will provide heat transfer between the back side of the wafer and the wafer support through gas phase thermal conduction.

The preferred embodiment of the invention is most advantageous for blanket CVD of tungsten, performed at pressures of from 10–100 Torr and at wafer temperatures at from 425°–525° C. The process is preferably performed with a nucleation step in which $WF_6$ is reduced with silane, followed by a deposition step in which $WF_6$ is reduced with hydrogen.

In an alternative embodiment of the invention, the reactor can be advantageously used for the selective deposition of tungsten, intended to coat contacts and fill vias. With this embodiment, the susceptor surfaces contacting the wafer, particularly the lip surrounding the edge of the wafer and the upper support surface on which the wafer rests, as well as the exposed screws and devices fastening them and the ring seals contacting them, are formed of material on which tungsten either will not nucleate or will nucleate only in an unacceptably long nucleation time. Such materials may include aluminum oxide, boron nitride, polyimide and some forms of quartz. Furthermore, the lip ring and upper support surface of the susceptor are removable and replaceable, the susceptor can be converted between non-selective applications.

In this selective tungsten deposition application, the process is preferably performed at pressures from 0.1-10.0 Torr and at temperatures from 250°-400° C. At these lower pressures, the wafer may be held on the susceptor with electrostatic clamping, rather than a vacuum behind the wafer.

The apparatus of the present invention achieves the objectives set forth above and overcomes problems of the prior art. Used with blanket tungsten deposition processes, in excess of 50% $WF_6$ consumption may be realized, and deposition rates several times higher than conventionally achieved can be obtained.

The present invention is particularly advantageous in enhancing the speed of application, quality and uniformity of CVD applied films onto silicon wafers by wafer temperature controlled processes, and to other temperature controlled silicon processing methods such as annealing. Many features of the present invention are advantageous in the CVD of blanket tungsten, selective tungsten and titanium nitride onto silicon semiconductor wafers, and to the CVD of other materials such as tungsten silicide, tantalum oxide, aluminum and copper, as well as oxides such as $SiO_2$.

Many features of the present invention are useful with processing devices that do not include the rotating susceptor. The plasma cleaning features of the present invention provided advantages when used with the semiconductor wafer processing applications discussed herein, and other applications where deposits and contaminants tend to form. In addition, the features that confine the heat to the susceptor, and those that enhance the flow of gases in the reactor in a smooth and non-turbulent manner, have broad utility in semiconductor wafer processing.

These and other objectives and advantages of the present invention will be more readily apparent from the following detailed description of the drawings in which:

BRIEF DESCRIPTION OF THE DRAWINGS

FIG. 3A is a cross-sectional view taken along line 3A—3A of FIG. 3.

DETAILED DESCRIPTION OF THE DRAWINGS

Figure 1:
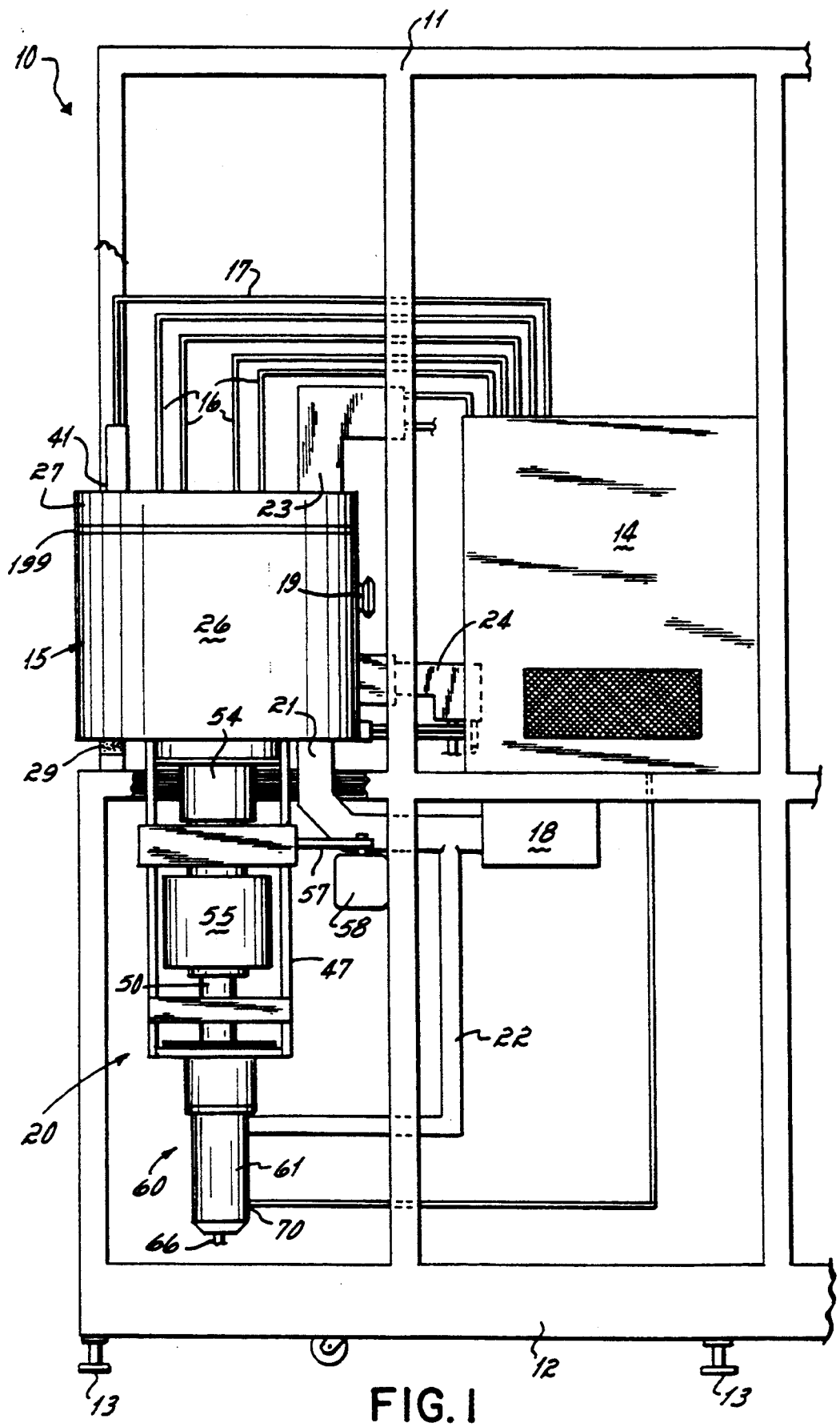
FIG. 1 is an elevational view of a CVD module for a wafer processing cluster tool embodying principles of the present invention.

FIG. 1 illustrates a CVD module 10 for a wafer processing cluster tool in which are embodied features of the present invention. The module 10 includes a frame 11 on a wheeled base 12, which has depending therefrom a set of adjustable feet 13 for leveling the module 10 and anchoring the module 10 to a floor. The module 10 includes a cabinet 14 fixed to the frame 11 that contains flow controllers with connections for inlet lines for supplying reactant gases to a chemical vapor deposition (CVD) reactor 15, also fixed to the frame 11. The cabinet 14 has associated with it other parts of the reactor support system that are not shown, including fluid conduits, valves, pumps, controls, and associated hardware for the operation of the reactor 15 including the supplies and connections to supplies of the various reactant gases, inert gases, purging and cleaning gases, and cooling fluids for the reactor 15.

The reactant gases for the main CVD process to be performed with the reactor 15, in the preferred embodiment of the invention, are gases used for a blanket tungsten deposition process onto silicon semiconductor wafers and are supplied through lines 16, shown as four in number, connected between the cabinet 14 and the reactor 15. These gases include, for example, tungsten hexafluoride ($WF_6$), hydrogen ($H_2$), and silane ($SiH_4$). The reactor is, however, also useful for titanium nitride films and for many other films that can be applied through a CVD process. Also supplied through one of the lines 16 may be inert gas such as argon. In addition, reactant gas for the plasma cleaning of the chamber 15, such as nitrogen trifluoride ($NF_3$) gas, is supplied through a gas inlet line 17 connected between the cabinet 14 and the reactor 15. The module 10 also includes one or more vacuum pumps 18, and usually one high volume low vacuum pump and one low volume high vacuum pump, for evacuating the reactor 15, for maintaining a vacuum within the reactor 15 at the required operating pressure levels, and for exhausting unused reactant gas, reaction byproducts, cleaning gases and inert gases flowing through the reactor. A residual gas analyzer port 19 is provided for monitoring the constituents of the gas.

The reactor 15 includes a susceptor rotating and wafer elevating mechanism 20 depending from the bottom of the reactor 15. The main evacuation of the reactor 15 is accomplished through a vacuum outlet line 21 connected between the reactor 15 and the vacuum pump or pump assembly 18 while one or more auxiliary vacuum outlet lines 22 are provided, connected between the mechanism 20 and the pump assembly 18. A combined upper electrode electrical terminal and cooling fluid manifold connector 23 and a combined lower electrode electrical terminal and cleaning gas connector 24 are also connected between the reactor 15 and the support systems in the vicinity of cabinet 14.

Figure 2:
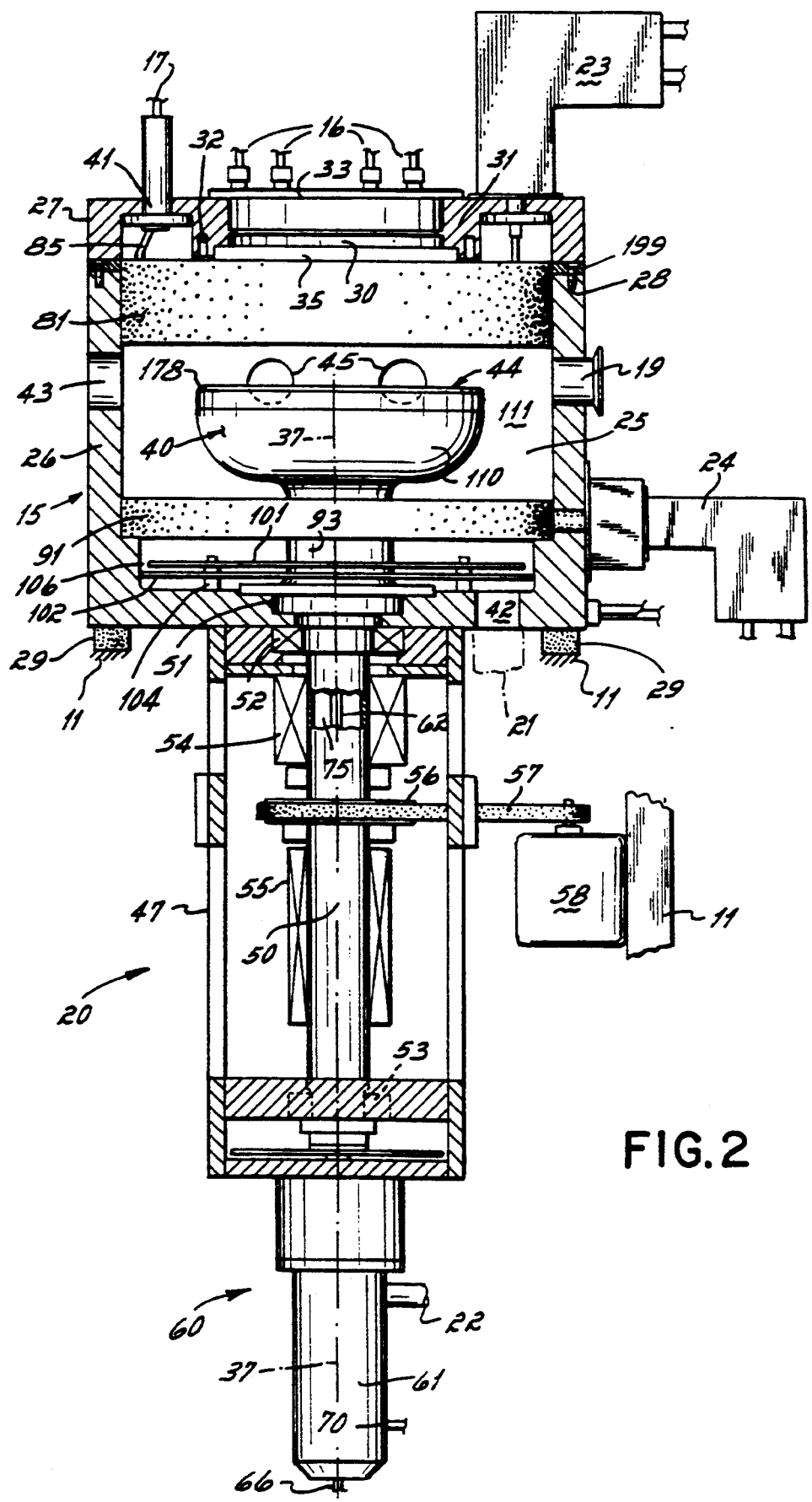
FIG. 2 is a cross-sectional view of a CVD reactor of the module of FIG. 1.

Referring to FIG. 2, the CVD reactor 15 has sealed within it a reaction chamber 25 enclosed in a housing 26 by which the reactor 15 is mounted through rubber vibration absorbing pads 29 to the frame 11 and from the bottom of which the mechanism 20 is supported. The housing 26 is preferably made of aluminum with a highly polished interior, and is provided with independent temperature control, both for heating and cooling of the reactor wall, to produce what is sometimes generically referred to as a cold wall reactor, as distinguished from an oven type reactor in which the susceptor is heated by radiant heat from a heated reactor wall. The housing 26 is preferably fluid cooled, by a suitable fluid such as ethylene glycol or water. In addition, resistance heating elements (not shown) are also provided in the housing 26 so that the housing may be heated, or, alternatively or in addition, rod type heating elements may be provided in the chamber at various locations. One or more of the heating or cooling features may be employed in the same structure, depending on its intended applications. The heating and cooling of the reactor wall may be zone controlled, and may have both the heating and cooling active simultaneously for more responsive temperature regulation and uniformity.

Figure 4:
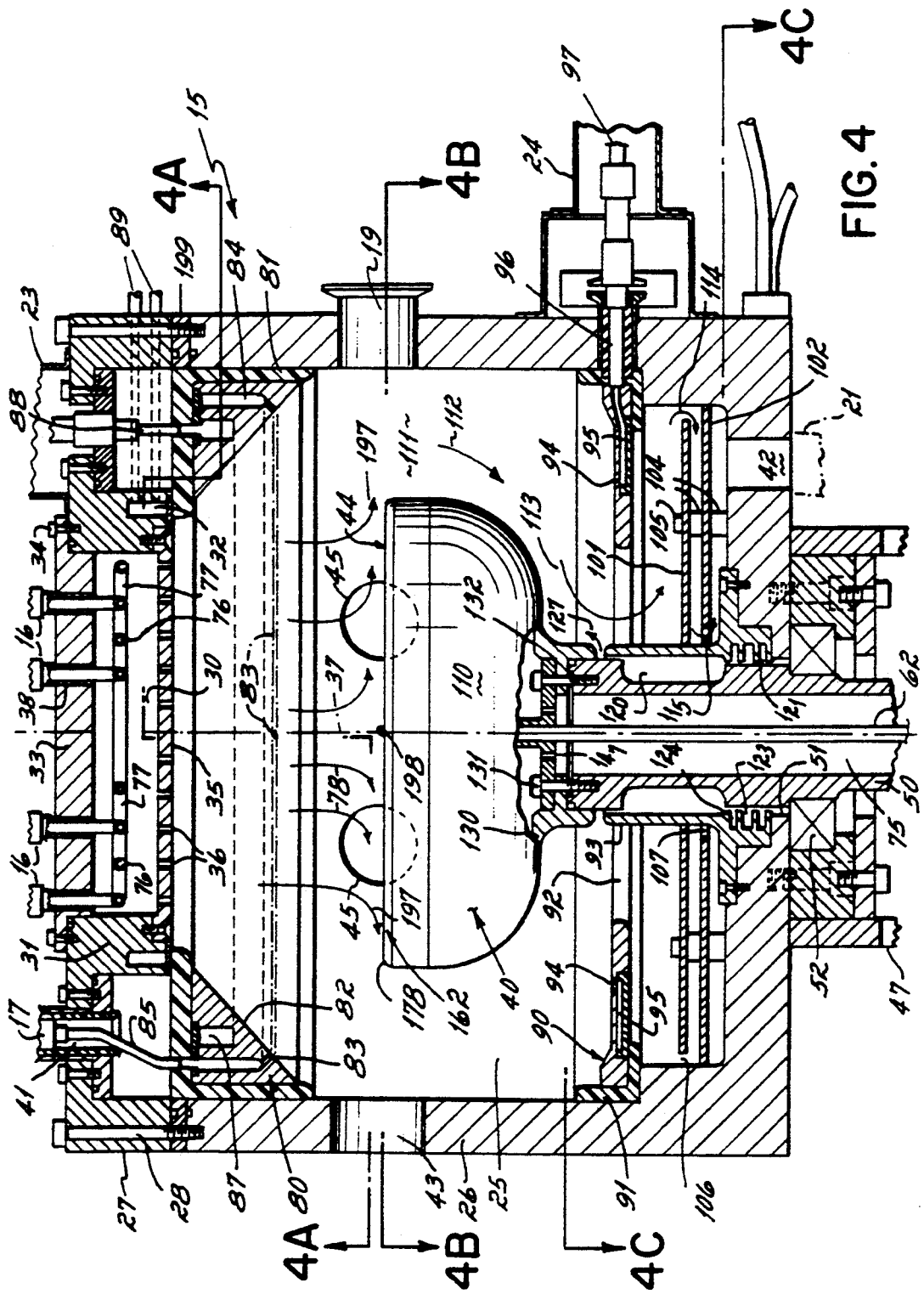
FIG. 4 is a cross-sectional view of the upper part of the reactor of FIG. 2 illustrating the processing chamber portion.

The housing 26 has, at the top thereof, a chamber cover 27, preferably also of aluminum, encloses the reaction chamber 25 within. The cover 27 is pneumatically sealed against the top of the housing 26, or spacers 199 if employed, and may be pneumatically held thereto or may be mechanically secured thereto by screws 28 or clamps. In FIG. 2, the screws 28 are shown securing spacers 199 to the top of the housing 26. The cover 27 has a reactant gas mixing chamber 30 surrounded by an annular mixing chamber wall which may be formed integrally of the aluminum chamber cover 27 or of a separate material such as a machinable ceramic or separate aluminum or other metal piece and secured to the underside of the chamber cover 27. The mixing chamber wall 31 is capable of being actively cooled, where the process, for example a tungsten deposition process, so requires, by cooling fluid supplied to flow through an annular passage 32 formed in the wall 31 to maintain it at a temperature lower than the reaction temperature that is independent of that of the housing 26 and that of the chamber cover 27. Like the housing 26, the mixing chamber wall 31 is also provided with resistance heating elements (not shown) to heat the wall and the mixing chamber 30 where the process so requires, such as for titanium nitride deposition. This annular wall 31 may be made of a thermally nonconductive material or of a conductive material thermally insulated from the aluminum material of the cover 27 to provide greater flexibility in the control of its temperature. The upper portion of the mixing chamber 30 is closed by a removable cover or top plate 33, preferably of stainless steel, which is sealably connected to the chamber cover 27 by bolts 34 (FIG. 4). The chamber housing 26, chamber cover 27 and top plate 33 form a sealed vessel enclosing an internal volume that is maintained at a vacuum pressure level during operation of the module 10.

The bottom of the gas mixing chamber 30 is closed by a circular showerhead 35 connected to the bottom of the mixing chamber wall 31. The showerhead 35 may be made of aluminum or of a machinable ceramic material and has a highly polished lower surface to retard the absorption of radiant heat from the higher reaction temperature from the area of a wafer being processed within the chamber 25. The showerhead 35 has, in one acceptable embodiment, a uniform pattern of holes 36 therethrough (FIG. 4), preferably arranged in a matrix or an array in plural concentric circles about the center thereof, which lies on a vertical axis 37 through the reactor 15. Alternatively, the showerhead 35 may be formed of a porous metal or ceramic plate.

A plurality of gas inlet ports 38 (FIG. 4) are provided in the top plate 33 to which the gas lines 16 are connected. A rotary wafer supporting susceptor 40 is provided within the chamber 25. The susceptor 40 lies on the axis 37 directly beneath the showerhead 35 and is in axial alignment therewith. A cleaning gas entry port 41 is mounted to the chamber cover 27 and is connected to the cleaning gas input line 17. The RF upper electrode terminal and cooling water connector 23 is also mounted to the chamber cover 27. The lower electrode RF terminal and cleaning gas connector 24 are mounted to the side wall of the housing 26. A single vacuum outlet port 42 is provided in the bottom of the chamber housing 26 to which the vacuum outlet line 21 is connected to the pump 18, which operates at a pumping rate of from 400-500 liters per second to achieve the wafer processing pressures at between 1 and 100 Torr, reactor cleaning pressures of from 0.1 to 100 mTorr, and wafer transfer pressures of $10^{-4}$ Torr within the chamber 25. A gate port 43 is provided in the forward wall of the housing 26 for connection to a transport module or wafer handling module of a cluster tool, to and from which wafers are loaded and unloaded of chambers 25 for processing. The gate 43 is approximately in horizontal alignment with an upwardly facing wafer supporting top surface 44 of the susceptor 40 whereupon a wafer is supported for processing with its upwardly facing side disposed horizontally parallel to and in vertical alignment with the showerhead 35. A plurality of ports 45 are provided in horizontal alignment with the wafer support surface 44 or the housing 26 on opposite sides of the reaction chamber 25 for inserting diagnostic or other instrumentation.

Fixed to the bottom of the housing 26 and aligned with the reactor axis 37 is a susceptor drive support frame 47. Rotatably mounted within the drive support frame 47 is a hollow susceptor drive shaft 50. The drive shaft 50 is mounted to rotate on its axis, which is on the reactor axis 37, extends through a hole 51 in the bottom of the reactor housing 26, and is rigidly connected to the bottom of the susceptor 40. At the hole 51, the shaft 50 is rotatably supported on a main bearing 52 having its inner race surrounding the shaft 50 in tight contact therewith and its outer race fixed to the frame 47 at the bottom of the housing 26. A secondary bearing 53, connected to the lower end of the frame 47, tightly surrounds and supports the lower end of the drive shaft 50. Secured to the support frame 47 immediately below the bearing 52 and tightly surrounding the shaft 50 is a ferrofluidic seal 54. The ferrofluidic seal 54 has fluid circulated through it at a temperature of less than 70° C. to prevent the ferrofluid within it from decomposing and losing its magnetic properties due to heat from the shaft 50. Above the secondary bearing 53 within the frame 47 and also surrounding the shaft 50 is an electrical slip ring connector 55. The slip ring 55 provides electrical connection with the rotating shaft 50 to supply electrical energy to the rotating susceptor and receives sensed temperature signals therefrom. Fixed to the shaft 50 between the seal 54 and the slip ring 55 is a drive pulley 56 which is drivably connected through a drive belt 57 with the output of a susceptor rotation drive motor 58.

Figure 3:
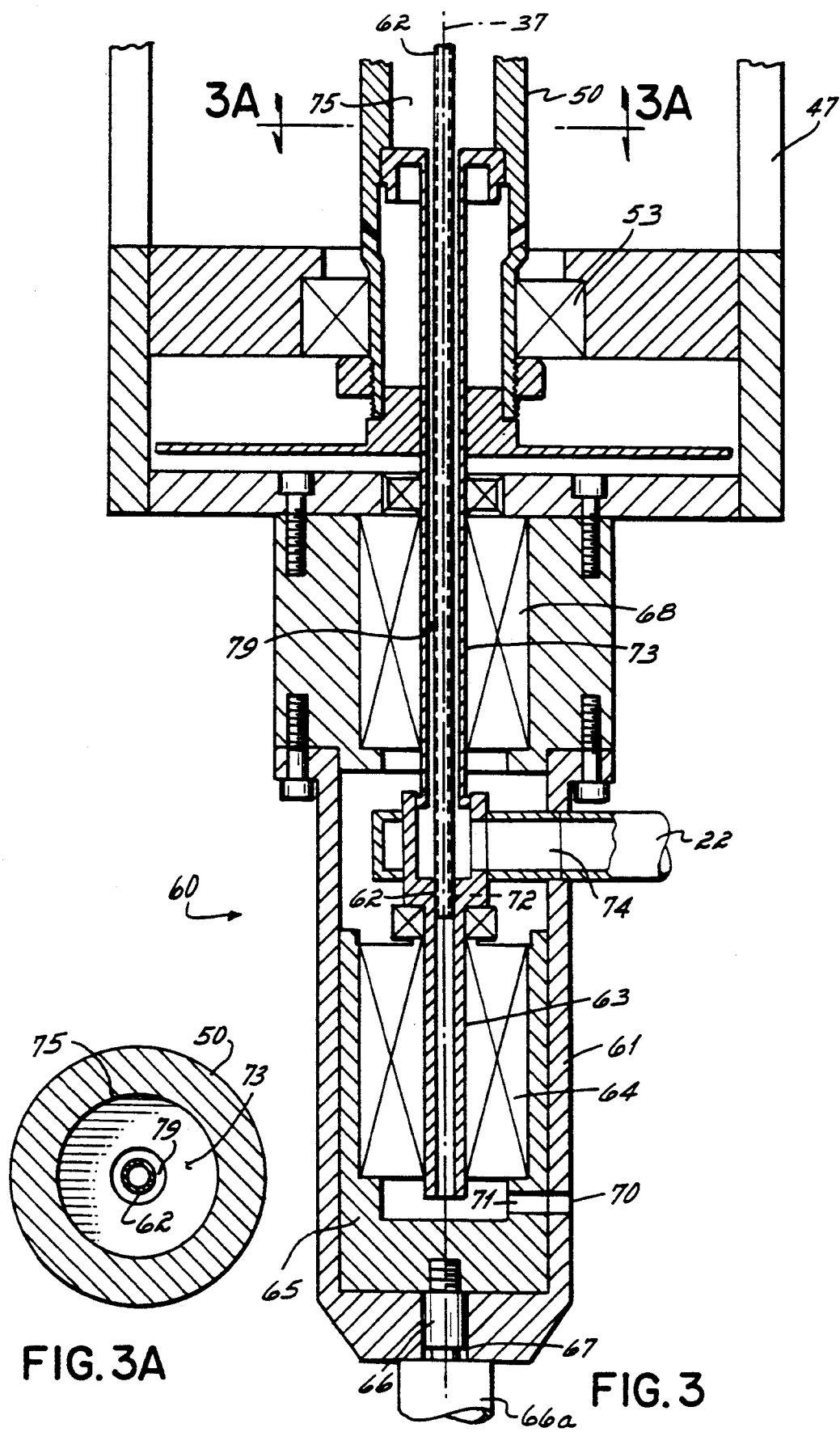
FIG. 3 is a cross-sectional view of the lower part of the reactor of FIG. 2 illustrating the susceptor rotation and wafer lifting portion.

At the lower end of the rotating and elevating mechanism 20, fixed to the bottom of the frame 47, is a wafer lift mechanism 60, illustrated in more detail in FIG. 3. The lift mechanism 60 includes an outer fluid-tight shell 61 with a hollow interior enclosing the lower end of a hollow and vertical lift tube 62. The tube 62 extends vertically from the lift mechanism 60 upwardly through the frame 47 and through the hollow interior of the drive shaft 50, along the axis 37 of the reactor, and into the chamber 25, terminating in the interior of the susceptor 40. The tube 62 rotates with the drive shaft 50 and slides axially therein a distance of approximately nine millimeters to raise and lower a wafer on the wafer support surface 44 of the susceptor 40 in the reaction chamber 25. The lower end of the tube 62 is fixed to a hub piece 63 and rotatably supported in a ferrofluidic seal 64, the outer surface of which is fixed in a sleeve 65 which is vertically slidable in the shell 61. The lower end of the sleeve 65 is linked to a vertical actuator 66 extending through a hole 67 in the bottom of the shell 61 of a linear action pneumatic lift 66a. Another ferrofluidic seal 68 is provided near the upper portion of the interior of the shell 61 surrounding the tube 62 on the axis 37 adjacent the bottom of the frame 47 of the rotating and elevating mechanism 20. As with the ferrofluidic seal 54, the seals 64 and 68 are supplied with fluid that is maintained at a temperature of 70° C. or less.

A source of helium gas (not shown) is connected to a helium gas inlet port 70 at the bottom of the shell 61 of the lift mechanism 60. The inlet port 70 communicates with a helium inlet channel 71 at the base of the hub piece 63, which communicates through the hollow interior thereof with an axial bore 72 of the tube 62, extending the length thereof, to communicate with the channel 176.

A vacuum outlet port 74 is provided in the shell 61 and connects with an elongated hollow tube 73 to apply vacuum in a hollow space 75 within the drive shaft 50 at the upper end thereof surrounding the tube 62, as illustrated in FIG. 3A. The hollow space 75 extends the length of the drive shaft 50 and also communicates with the interior of the susceptor 40 within the reaction chamber 25. In one embodiment, described in more detail in connection with FIG. 6B below, the vacuum pressure at the port 74 is maintained at a pressure sufficiently lower than that of the chamber 25 to develop a vacuum in the susceptor 40 to operate as a vacuum chuck to hold a wafer against the susceptor surface 44 during processing. This vacuum clamping pressure is communicated between the vacuum port 74 and the space 75 at the top of the drive shaft 50 through an annular column 79 that surrounds the tube 62 and lies within the tube 73. In other embodiments that do not use vacuum clamping, the vacuum at port 74 is maintained at a pressure that will develop a vacuum in the susceptor 40 that is equal to or slightly greater than the pressure in the chamber 25. In this way, the entry of reactant gases into the susceptor prevented, as with the embodiment of FIG. 6, described in more detail below.

Figure 4A:
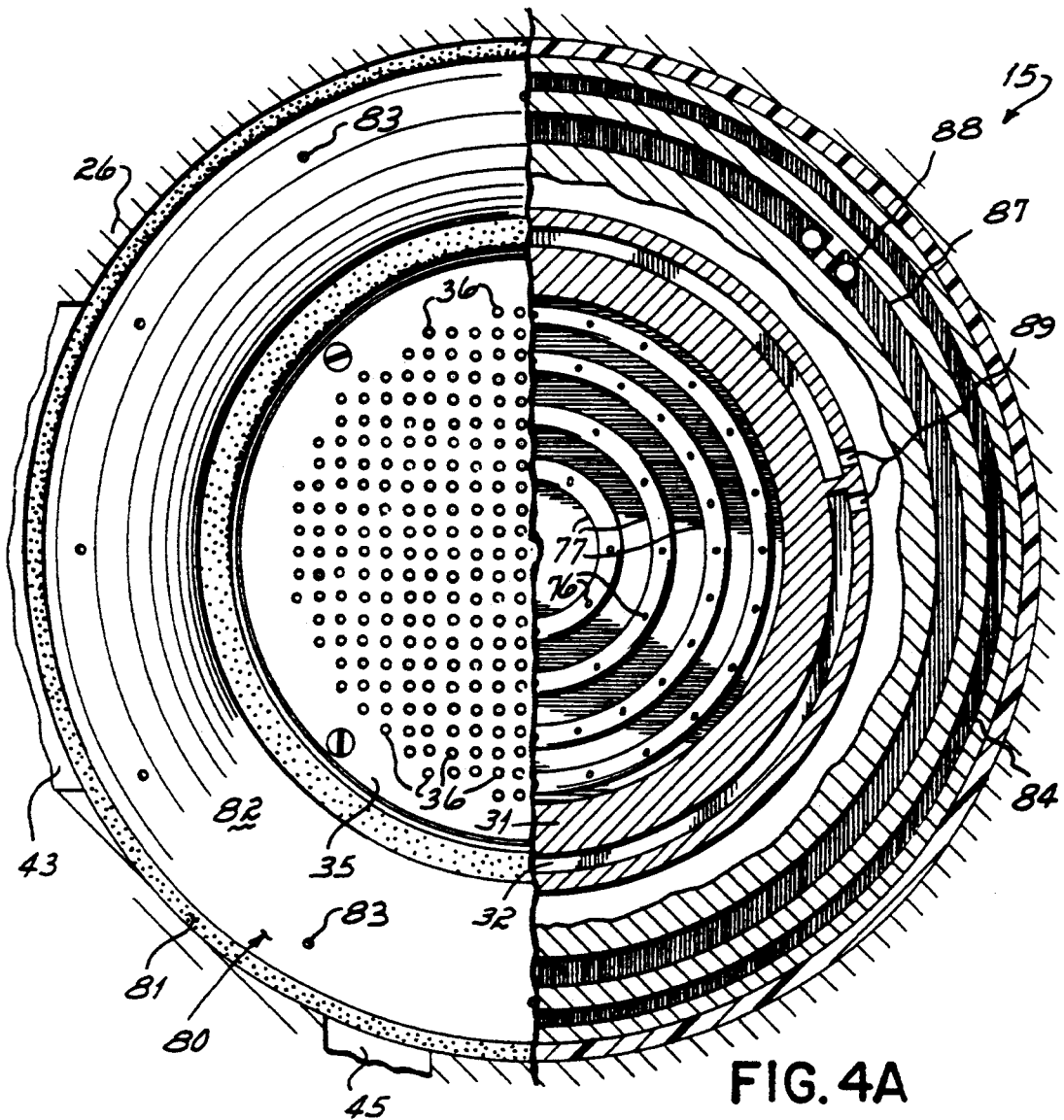
FIG. 4A is a cross-sectional view taken along line 4A—4A of FIG. 4.

The details of the reaction chamber portion of the CVD reactor are illustrated in FIG. 4. The gas mixing chamber 30 is provided with four concentric hollow tubular rings 77, one connected to each of the inlet ports 38, as illustrated in FIGS. 4 and 4A. Each of the rings 7 has a plurality of holes 76 spaced along them and around the axis 37 to allow a uniformly distributed flow of each of the gases from the inlet ports 38 and into the gas mixing chamber 30, where they are uniformly mixed, usually at subreaction temperature. From the gas mixing chamber 30, the uniformly mixed gas from the various inlet ports 38 flows downwardly through the plurality of holes 36 in the showerhead plate 35 parallel to the axis 37 and perpendicular to the wafer support surface 44 of the susceptor 40 as represented by arrows 78.

Surrounding the showerhead 35 is an annular plasma cleaning electrode 80 mounted on a insulator 81, of teflon or other suitable insulating material, secured to the aluminum chamber cover 27. This electrode is energized to generate a plasma for plasma cleaning of the chamber. The electrode 80 has an inner surface 82, which is frustoconical in shape and angled to present a smooth transition from the diameter of the showerhead 35 to the larger diameter of the chamber housing 26 to prevent turbulence in the downwardly flowing reactant gases. A plurality of gas inlet orifices 83 are provided around the surface 82 and communicate with a cleaning gas passage 84, which is annular in shape, within the electrode 80. The passage 84 communicates with a supply tube 85, which connects to the gas inlet 41 to which the cleaning gas inlet line 17 is connected.

An annular cooling passage 87 communicates through a tube 88 with a cooling liquid and upper electrode connector 23 (which contains both feed and return lines, which are not shown, for the cooling liquid). Radio frequency energy (RF) is fed to the electrode 80 through the tube 88 from the connector 23. Cooling liquid such as ethylene glycol or water is separately provided through cooling liquid inlet and return ports 89 to the cooling passage 32 in the mixing chamber wall 31.

Figure 4B:
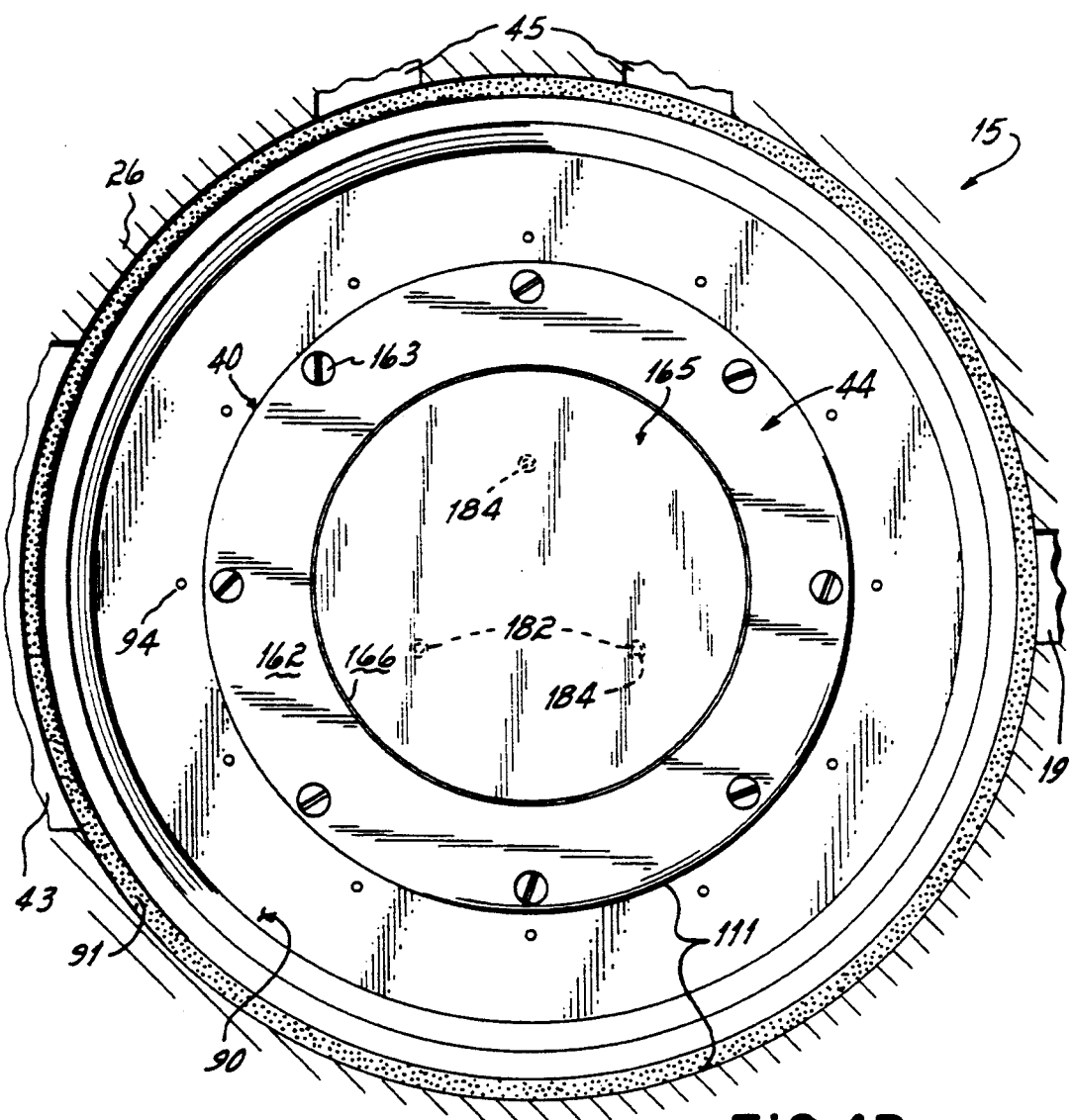
FIG. 4B is a cross-sectional view taken along line 4B—4B of FIG. 4.
Figure 4C:
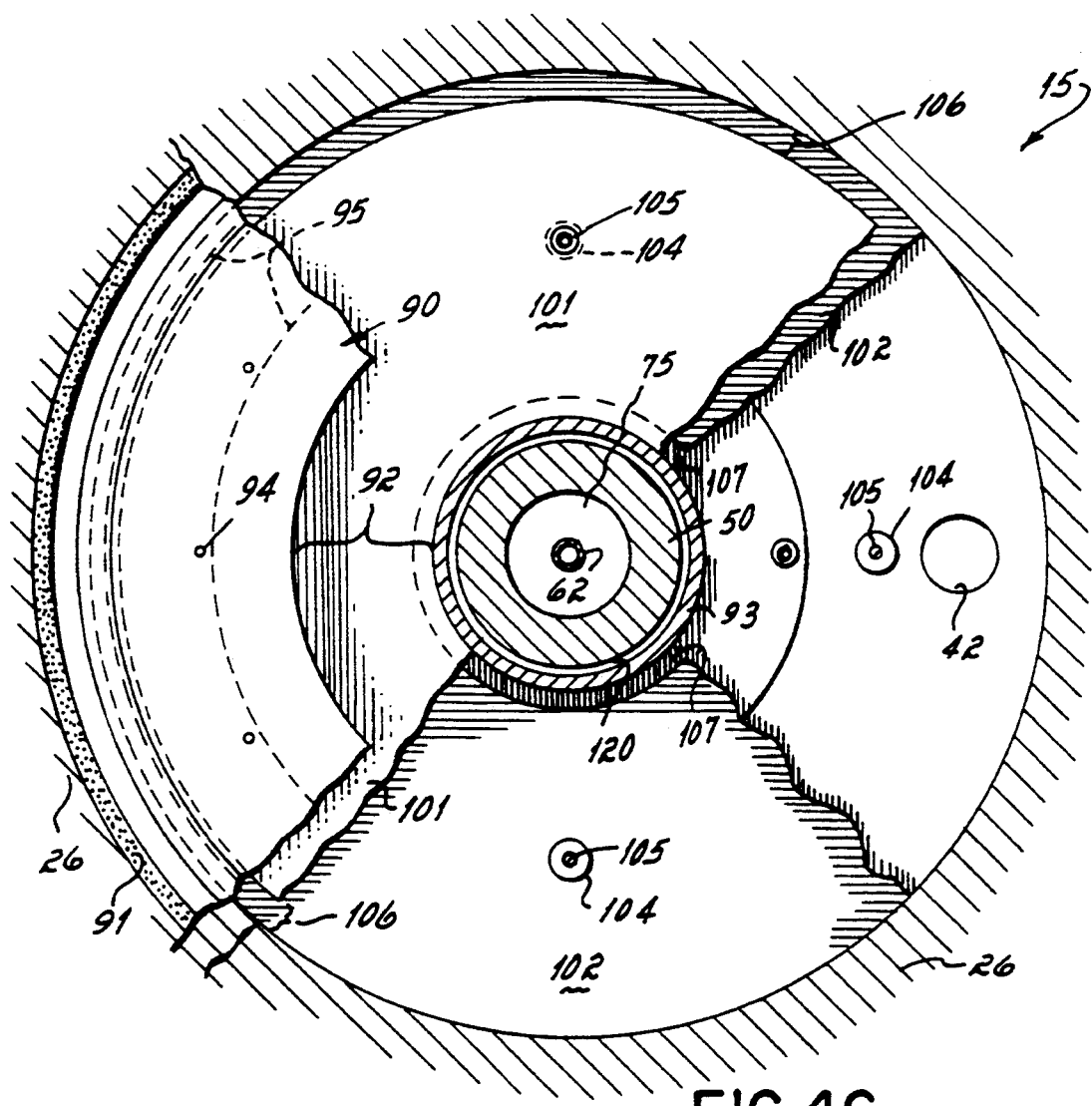
FIG. 4C is a cross-sectional view taken along line 4C—4C of FIG. 4.

A lower plasma cleaning electrode 90 is provided at the base of the chamber 25 mounted to the chamber housing 26 on an electrical insulator 91, also of a suitable insulating material. The electrode 90 is in the shape of an annular ring which serves as a gas flow baffle between the processing portion of the chamber 25 and a vacuum outlet port 42, as illustrated in FIGS. 4, 4B and 4C. The electrode 90 defines an annular gas flow opening 92 between the electrode 90 and a sleeve 93 fixed to the base of the housing 26 and surrounding the susceptor drive shaft 50 through which the cleaning gas and cleaning by-products pass downwardly as they are exhausted from the chamber 25. Openings 94, provided around the top of the electrode 90, communicate with an annular passage 95 in the electrode 90, which in turn communicates with another cleaning gas supply tube 96, which in turn communicates with a cleaning gas inlet port 97 in the lower electrode terminal and cleaning gas connector 24. The electrode 90 is electrically connected to a power supply (not shown) that supplies RF energy through the tube 96 to the lower electrode 90 from the lower electrode terminal and connector 24. Cleaning gas for plasma cleaning of the interior of the internal components of the chamber 25, such as $NF_3$ gas, enters through the openings 83 and 94 in the respective electrodes 80 and 90 and exhausts through the port 42.

Two additional aluminum baffles 101 and 102 are provided between the electrode 90 and the base of the housing 26. The baffles 101 and 102 are stacked vertically on spacers 104 at the base of the housing 26 and secured thereto by a plurality of bolts 105. The upper one of these baffles 101 is disc shaped and extends from the sleeve 93 outwardly defining a space 106 annularly around the side wall of the housing 26. The lower one of these baffles 102 is also disc shaped and extends from the side wall of the housing 26 inwardly to define a space 107 annularly around the sleeve 93.

The susceptor 40 has an exterior side surface 110 which is smoothly contoured to minimize turbulence in the flow of reacting gases within the chamber 25. The surface 110, at its widest part, defines a space or opening between the susceptor 40 and the side wall of the chamber housing 26. The horizontal cross-sectional area of the opening 111 is greater than that of the opening or space 92 defined by the electrode 90, which is in turn greater than the horizontal area of the space 106 defined by the baffle 101, which is in turn greater than the horizontal cross-sectional area of the opening 107 defined by the baffle 102. The ratio of these areas provides a pressure gradient, when the reacting gas is flowing through the chamber 25, which minimizes turbulence and provides for the uniformity around the susceptor 40 of the gas flow through the chamber 25 to the single vacuum outlet port 42. This flow is illustrated by the arrows 112, 113, 114 and 115.

Figure 5:
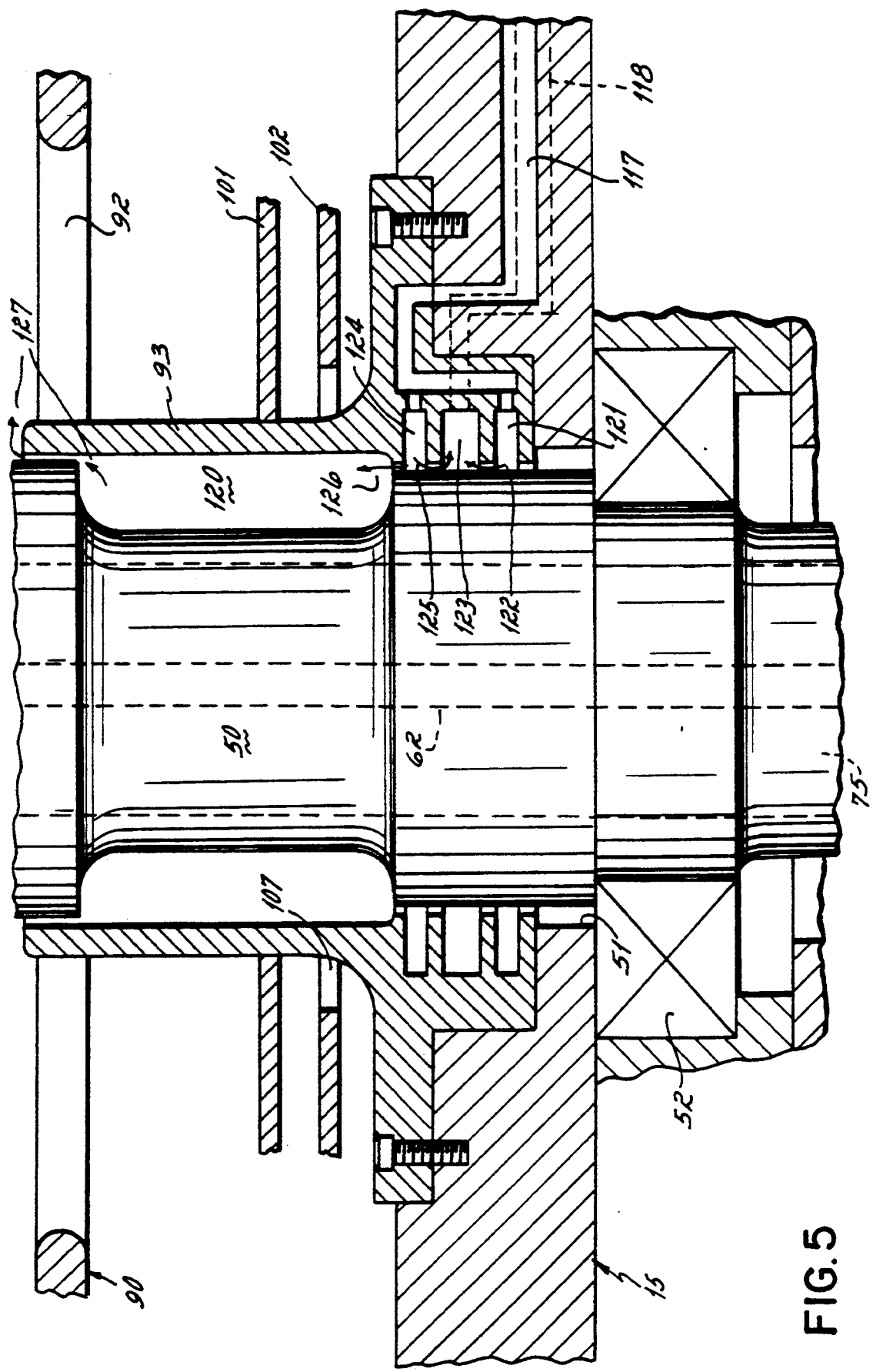
FIG. 5 is an enlarged cross-sectional view of a part of the chamber of FIG. 4 illustrating the structure in association with the susceptor drive shaft in the vicinity of the base of the housing of the reaction chamber in one alternative embodiment.

In certain situations, it may be desirable to incorporate an alternative structure to enhance the reliability and extend the life of the main bearing 52, as for example, where the life of the seal shortens time between scheduled reactor maintenance. Such an alternative to the structure at the point where the shaft 50 passes through the base of the housing 26 is illustrated in FIG. 5. In this alternative, the base of the housing 26 is provided a nitrogen gas inlet port 117 and nitrogen gas vacuum outlet port 118 (broken line) through which nitrogen gas is caused to flow in a space 120 between the susceptor drive shaft 50 and the sleeve 93 as illustrated in FIG. 5. Nitrogen gas flowing in through the port 117 is injected into an annular passage 121 surrounding the shaft 50 at the base of the sleeve 93, flows in the direction of the arrow 122 into an annular passage 123 above the passage 121 in the sleeve 93 and then out the port 118. Similarly, nitrogen gas flows into the third annular space 124, above the passage 123, from the port 117. Part of the gas from the passage 124 flows in the direction of the arrow 125 to the passage 123 and out the port 118 while a portion of the gas from the passage 124 flows in the direction of the arrow 126 into the space 120 and then in the direction of the arrow 127 into the reaction chamber approximately in the vicinity of the space or opening 92 around the outer edge of the lower cleaning electrode 90. This outward flow of nitrogen gas in the vicinity of the arrow 127 prevents the entry of the reactant gases into the space 120 during the reaction process. It also prevents particles and other contamination from entering the space 127.

Figure 6:
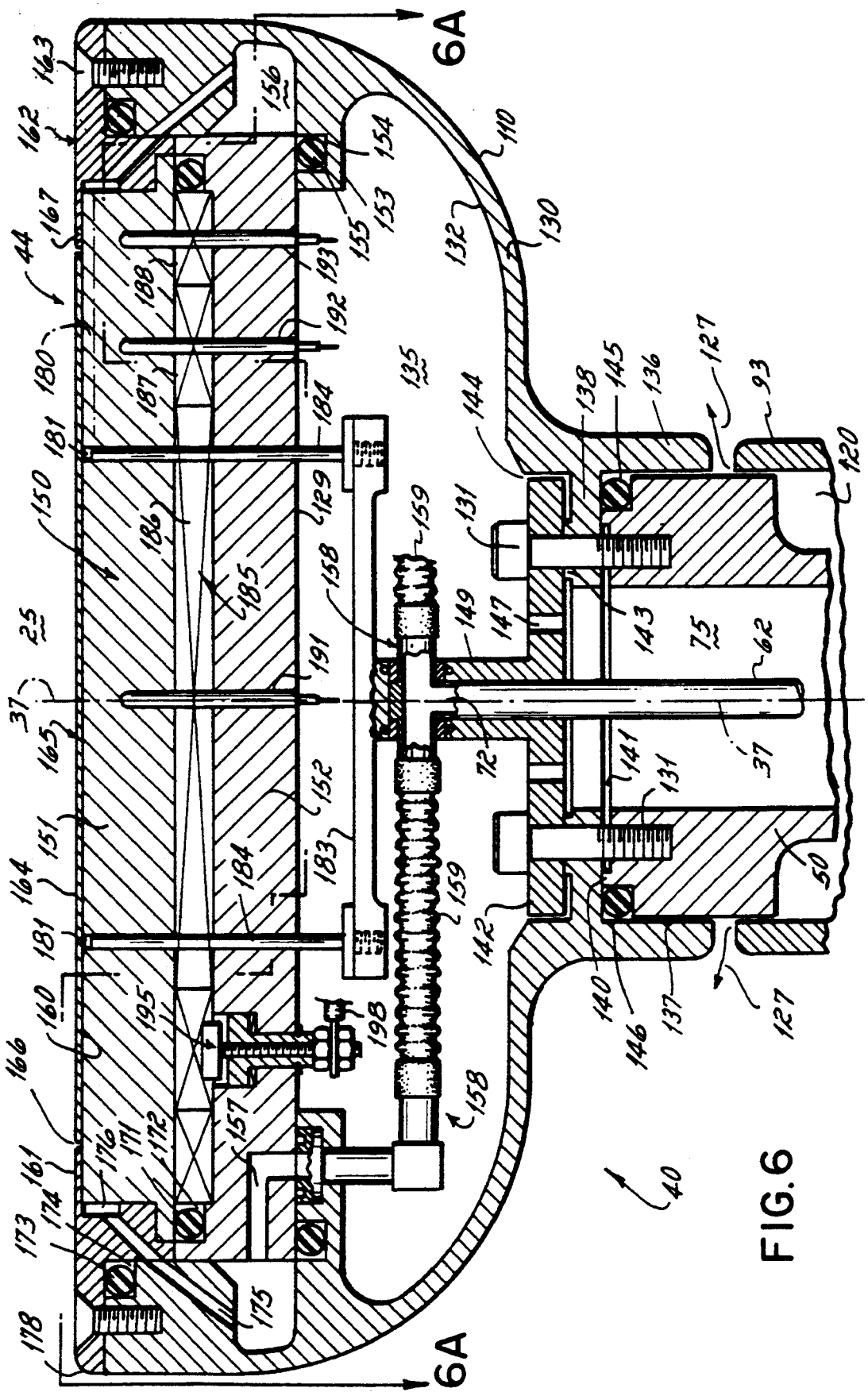
FIG. 6 is an enlarged cross-sectional view of the susceptor within the reaction chamber of FIG. 4.
Figure 6A:
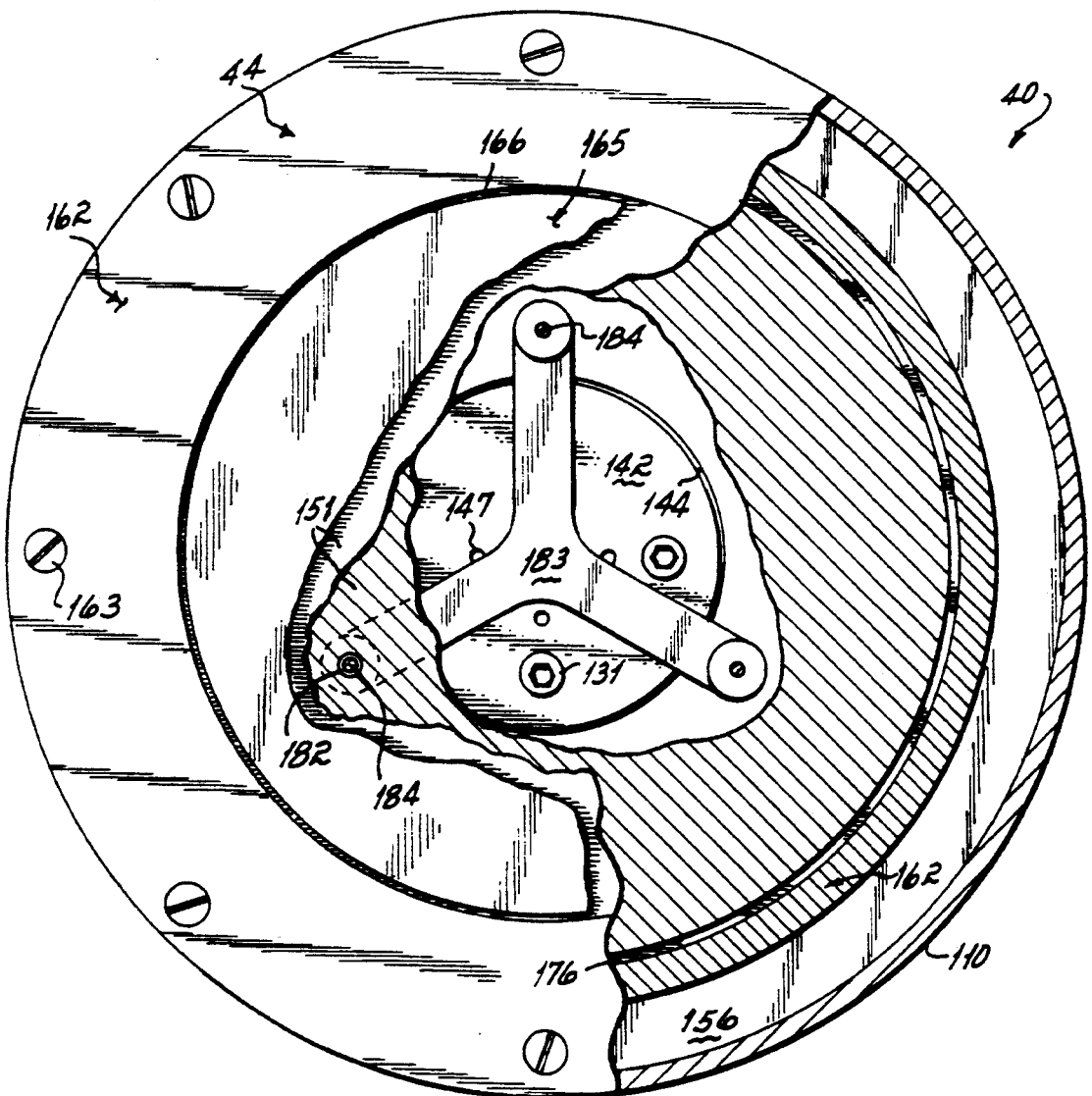
FIG. 6A is a cross-sectional view taken along line 6A—6A of FIG. 6.
Figure 6B:
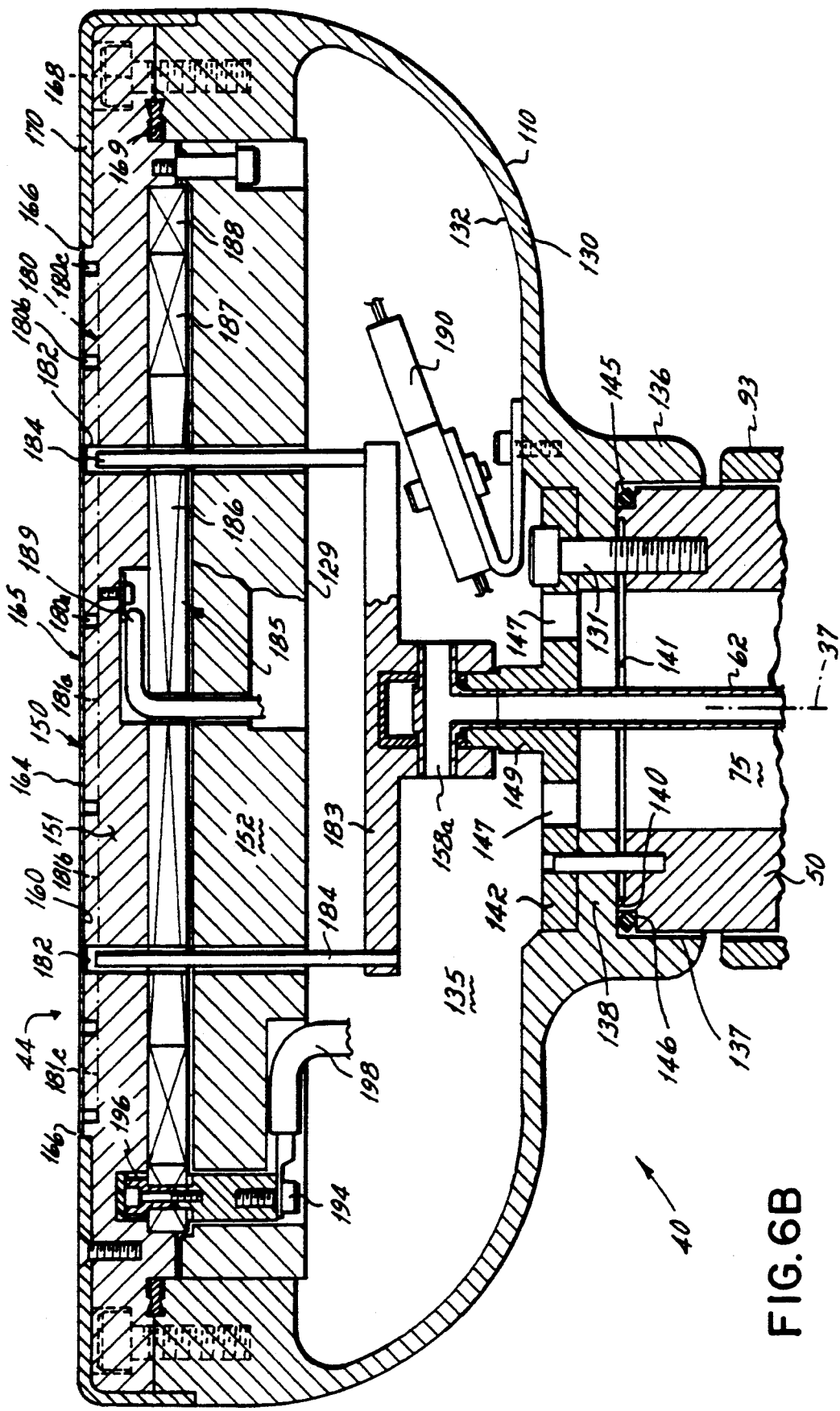
FIG. 6B is an enlarged cross-sectional view, similar to FIG. 6, of the susceptor of an alternative embodiment of the invention more particularly suited for blanket tungsten deposition processes.

The susceptor 40 is illustrated in two embodiments in FIGS. 6 and 6B. Each of these embodiments includes some of the alternative features that may be desirable depending on the application. FIG. 6A is a cross-sectional view that shows the placement of features that appear in one or both of the embodiments of FIGS. 6 or 6B. The susceptor 40 of the embodiment of FIG. 6 utilizes electrostatic wafer clamping, an electrically insulating wafer supporting surface, an insulating ring around the outer edge of the wafer support surface, RTDs for temperature sensing in the wafer support, an inert purge gas around the rim of the wafer, and an inert gas within the susceptor at a pressure at or slightly greater than the pressure within the chamber 25. Many of the features of the embodiment of FIG. 6 are more suitable for selective deposition of certain materials such as tungsten, as explained below.

The susceptor 40 of the embodiment of FIG. 6B utilizes vacuum wafer clamping, a metallic wafer support and a metallic scavenger ring around the outside of the wafer support, thermocouple temperature sensing in the wafer support, and an inert gas within the susceptor at a pressure less than that of the chamber 25. Many of the features of the embodiment of FIG. 6B are suitable for blanket deposition of materials such as titanium nitride and tungsten, also as explained below.

The susceptor 40 of FIGS. 6, 6A and 6B is provided with a thin outer metal wall 130 which is mounted by bolts 131 to the top of the drive shaft 50, as is better illustrated in FIG. 6, which illustrates the susceptor structure of one embodiment. The wall 130 is of a high heat conductive material, for example a metal such as aluminum, and has a thin cross-section to minimize the flow of heat from the upper portion of the susceptor to the shaft 50. The wall 130, which has as its outer surface the surface 110 of the susceptor 40, has a highly polished reflective inner surface 132 to reflect, and thus minimize the absorption of, heat from the downward facing surface 129 of the heated upper portion of the susceptor 40 and through the hollow inner space 135 of the susceptor 40. The outer surface 110 is provided with a dull finish to maximize heat radiation from the wall 130.

At the base of the susceptor wall 130, formed integrally therewith, is a downwardly extending collar 136 which surrounds the shaft 50 and is spaced therefrom to leave a small cylindrical gap 137 between the collar 136 and the shaft 50 to reduce direct heat conduction from the wall 130 to the shaft 50. Projecting inwardly from the collar 136 and formed integrally with the wall 130 is a susceptor mounting flange 138. At the upper end of the shaft 50 is an annular upwardly projecting shoulder 140 on which the flange 138, and thus the wall 130, is supported to thereby support the susceptor 140 for rotation with the shaft 50. The shoulder 140 presents a small contact area with the flange 138 to minimize thermal contact therebetween and minimize heat transfer from the susceptor wall 130 to the shaft 50. The upwardly extending shoulder 140 defines small gap 141 between the top of the shaft 50 and the flange 138 to further reduce direct heat conduction between the inner portion of the flange 138 and the top of the shaft 50.

Through the disc 142 extend bolts 131, which are threaded into the top of the shaft 50. In the embodiment of FIG. 6, the flange 138 has an upwardly extending shoulders 143 formed thereon to space the disc 142 from the flange 138, to present minimal contact area therebetween to reduce thermal conduction, and to define a further gap 144 between the flange 138 and wall 130 and the disc 142. These shoulders 143 are omitted from the alternative embodiment of FIG. 6B. Additional thermal insulation between the susceptor 40 and the shaft 50 may be achieved, if necessary, by providing a layer of insulating material, such as insulating washers or spacers, between the flange 138 and the shaft 50. A seal 145 (shown as an O-ring in FIG. 6 and as a soft metal seal in FIG. 6A) is provided in an annular space 146 formed around the outside of the upper end of the shaft 50 between the shaft 50 and the collar 136 and flange 138 of the susceptor wall 130. A plurality of holes 147 is provided through the disc 142 to communicate between hollow space 75 within the shaft 50 and the space 135 within the susceptor 40 to provide for the maintenance of a vacuum within the space 135 at approximately 10 Torr.

Projecting upwardly from the top of the disc 142 on the axis 37 is a vertical hub portion 149 which has an interior hole through which the top end of the hollow lift rod 62 extends.

The upper portion of the susceptor 40 includes a wafer support structure 150 formed of a pair of discs including an upper disc 151 and a lower disc 152.

In this embodiment of FIG. 6, the lower disc 152 is supported at its outer edge on an inwardly extending support flange 153 formed integrally of the susceptor wall 130 and having an annular channel 154 on the upper surface thereof which contains a seal 155 to isolate an annular space 156, formed between the outer rim of the disc 152 and the wall 130, and the space 135. In this embodiment, the space 156 is a helium distribution channel which communicates through a circumferentially spaced set of ducts 157 with helium supply tubes 158 which extend radially from and mechanically connect to the top end of the tube 62 above the top surface of the hub 149. With this arrangement, helium gas is caused to flow upwardly through the tube 62 and outwardly through the tubes 158 and up through the ducts 157 and into the channel 156. The tubes 158 have flexible mid sections 159 to permit vertical movement of the lift rod 62 with respect to the wall 130 while the outer ends of the tubes 158 are stationary with respect to the flange 153. This helium gas is maintained at a separately regulated pressure to produce a pressure that is equal to or very slightly greater, at the gap 166, than the pressure of the reactant gases flowing immediately above the gap 166.

Also in the embodiment of FIG. 6, the upper disc 151 is supported on the top of the lower disc 152 and has an upper wafer supporting surface 60 thereon, which forms part of the upper susceptor surface 44, the remainder of which is formed by an upper surface 161 of an annular susceptor lip piece 162. As illustrated in FIGS. 4B and 6, the lip piece 162 is bolted to the top of the susceptor wall 130 by bolts 163. The lip 162 is shaped such that its upper surface 161 lies in the same horizontal plane as the upper surface 164 of a wafer 165 when the wafer 165 is supported on the surface 160. A small annular gap 166 around the perimeter of the wafer 165 provides sufficient clearance between the lip 162 and the wafer 165 to allow for thermal expansion of the wafer and for wafer diameter tolerances. The relationship of the lip 162 to the wafer 165 thus avoids turbulence in the flow of gas across the surface of the wafer 165 and the upper surface 44 of the susceptor 40.

In the embodiment of FIG. 6, the disc 151 rests on a seal 171 in a channel 172 in the top of the lower disc 152, and a further seal 173 is provided in a channel 174 at the top end of the susceptor wall 130 between the lip 162 and the susceptor wall 130.

In the susceptor of the embodiment of FIG. 6, through the upper portion of the susceptor wall 130 and the lip 162 is a circular array of ducts 175 which communicate between the helium channel 156 and a peripheral channel 176 surrounding the upper disc 151 beneath the lip 162. This provides a path for helium gas to flow from the annular space or channel 156, ducts 175, channel 176 and outwardly through the gap 166 around the perimeter of the wafer 165 to prevent the flow of reactant gases downwardly into the gap 166 around the perimeter of the wafer 165 and to provide for smooth flow of the reactant gas outwardly across the surface 164 of the wafer 165 and the surface 161 of the lip 162. The outer edge 178 of the lip 162 is rounded to further avoid turbulence as the gas flows around the edge of the susceptor 40.

For uses such as blanket deposition of tungsten, the support structure 150 and the lip 162 are preferably made of Monel, which resists sputtering during plasma cleaning with NF$_3$ better than do some other metals. In such processes, the lip 162 serves as a scavenger for unused reactant gases. For selective deposition processes, the disc 151 and the lip 162 are made of a material on which the tungsten to be deposited will not nucleate, as nucleation of the material on the susceptor surfaces adjacent the wafer causes film to deposit on the wafer in blanket fashion near such surfaces.

The susceptor of the embodiment of FIG. 6 includes features suitable for the selective tungsten deposition process. The discs 151 and 152 of this embodiment are made of an insulating material such as graphite, to both prevent nucleation onto the support and to support a charge for electrostatic clamping of the wafer to the susceptor. For selective deposition, because it is frequently desirable to operate the process at pressures of 1 Torr or less, vacuum clamping will not be effective. The absence of vacuum clamping also renders the edge purging feature provided by injecting helium into the cavity 176 more effective, as this feature, without elaborate sealing techniques, may cause helium gas to flow below the wafer and destroy the pressure differential needed for vacuum clamping of the wafer, or may have the counterproductive effect of facilitating the flow of reactant gas beneath the wafer and into the space 135 within the susceptor.

In the embodiment of FIG. 6, a plurality of preferably three lift pins 184 are provided, each slidable in holes 181 through the disks 151 and 152 of the susceptor 40. The holes 181 are no larger than necessary to allow the pins 184 to slide, and to otherwise minimize flow of gas through the holes 181 between the back of the wafer and the space 135 within the susceptor.

The features of the susceptor of the embodiment of FIG. 6B are more suitable for the deposition of blanket tungsten, and accordingly, the remainder of the structure of the susceptor 40 will be described in connection with the embodiment of this figure.

Referring to FIG. 6B, the discs 151 and 152 may be made of a material such as Monel. Within the disc 151 may alternatively be provided ducts 180 (shown by phantom lines), if desired, to distribute helium gas across the back surface of the wafer 165 for thermal gas conduction between the disc 151 and the wafer 165. These ducts 180 are remote from the edge space 166 around the rim of the wafer 165 so that the flow of reactant gas into the space behind the wafer is not enhanced thereby.

Figure 7:
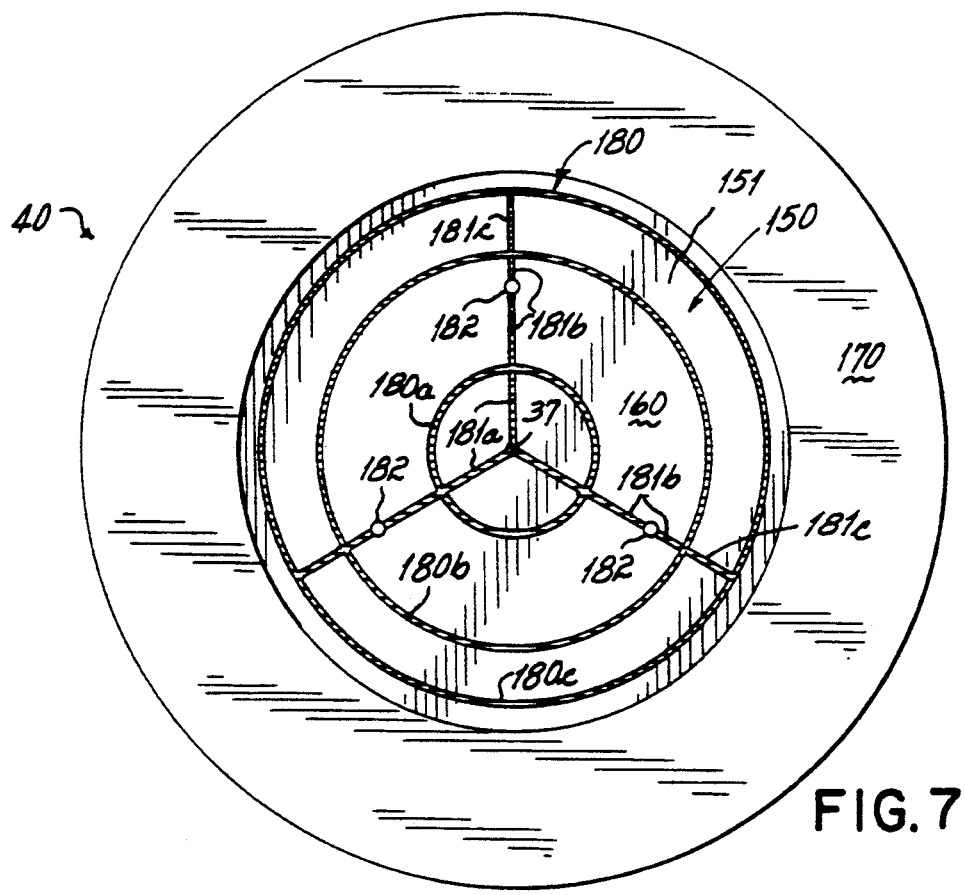
FIG. 7 is a top view of the susceptor of FIG. 6B, but with the wafer removed.

The ducts 180 are in the form of grooves in the upper surface of the disk 150 as illustrated in FIG. 7. They include three concentric circular grooves 180a, 180b and 180c interconnected by three sets of radial grooves spaced 120° apart, including grooves 181a, which interconnect on the axis of the susceptor 37 and extend to the innermost circular groove 180a, radial grooves 181b which interconnect circular groove 180a, the intermediate one of the circular grooves 180b and a respective one of the holes 182, and radial grooves 181c, which interconnect circular groove 180b with the outermost circular groove 180c.

Gas at the backside of the wafer 165 is maintained at a pressure lower than in the reaction chamber 25 by way of oversize vertical holes 182 that, unlike the embodiment of FIG. 6, fit loosely around the lift pins 184 and thus communicate between the back of the wafer 165 and the space 135 within the susceptor 40 to provide for vacuum clamping of the wafer 165 to the surface 160. The helium gas that fills the space 135 is helium that is maintained at a separately regulated pressure through the openings 147 in the disc 142 that communicate between the space 135 and the space 75 at the top of the drive shaft 50. Helium is supplied into the space 135, in the embodiment of FIG. 6B, through the short tube 158a. The vacuum clamping pressure may be maintained in the space 135 at approximately 10 Torr where reaction pressure in the reaction space of the chamber 25 above the wafer 165, for blanket tungsten CVD processes, is at approximately 50 to 60 Torr.

With processes such as selective tungsten CVD, which may be performed at 0.1 to 5.0 Torr, rather than vacuum clamping of the wafer, other clamping means such as electrostatic clamping, as illustrated in the FIG. 6 embodiment, may be preferable, but some helium should still be provided behind the wafer, at or very slightly above the reaction chamber pressure to enhance heat transfer between the wafer and the disk 151.

In the embodiment of FIG. 6B, the upper disk 151 extends over the top of the susceptor wall 130 and is bolted directly thereto by recessed bolts 168, compressing a flat soft metallic seal 169 between the disk 151 and the susceptor wall 130. An alternate form 170 of the lip 162 is fastened by countersunk screws to the top of disk 151, covering the screws 168 and mounted flush so as to form a continuous surface with the top surface 164 of the wafer 44 and the outer surface 110 of the susceptor wall 130. This form of lip 170 is most suitable when it is made of a metallic material such as Monel.

In the susceptor of both the embodiments of FIGS. 6 and 6B, mounted to the top of the lift rod 62 above the tubes 158 and directly above the hub or bushing 149 of the disc 142 is a horizontal table 183 which moves upward and downward with the lift rod 62. Extending upwardly from the periphery of the table 183 through the holes 181 (FIG. 6) or 182 (FIG. 6B) is a plurality of preferably three lift pins 184 which, when elevated, will contact the underside of the wafer 165 to lift it from the surface 160 or lower into the holes 181 or 182 (the position illustrated in FIGS. 6 and 6B) to lower the wafer 165 onto the surface 160. At the upward position of the table 183, the wafer 165 will be in position for transfer into and out of the chamber through the gate port 43 (FIG. 4), and at the downward position of the table 183 at which the wafer 165 is lowered onto the surface 160, the wafer is in position for processing.

Also in the susceptor of both the embodiments of FIGS. 6 and 6B, there is mounted between the discs 151 and 152 a resistance heater 185 which includes a central circular element 186, an intermediate annular element 187 and an outer annular element 188, each providing a plurality of separately controllable heater zones at various radii on the wafer support 150. In the embodiment of FIG. 6, each of the zones is provided with a temperature sensing element 191, 192 and 193 of the RTD or thermocouple type respectively corresponding to the areas heated by the elements 186, 187 and 188. Each of the elements is provided with a spring loaded electrical contact assembly 195 (only one of which is shown in FIG. 6 with respect the intermediate element 187). Two contacts are provided for each of the heating elements 186, 187 and 188. Electrical conductors 198 for these elements and for the sensors 191, 192 and 193 extend downwardly through the shaft 50 to make electrical connection through the slip ring 55 (FIG. 2) with power supplies and control circuits.

In the embodiment of FIG. 6B, three temperature sensing elements 189 of the thermocouple type (only one of which is shown in FIG. 6B, extend through holes in the heaters 186, 187 and 188 to recesses in the backside of disc 151, one directly overlying each of the heater zones. Readings from these thermocouples are fed back to a heater controller (not shown) to maintain uniform temperature on the disk 151. Each of the thermocouples 189 connects to the controller through a wire in the shaft 50 at a bracket mounted connector 190 on the wall 130 and in the space 135. The electric connectors to the heater terminals are illustrated in the FIG. 6B embodiment in their preferred form 196, recessed into the lower surface 129 of the lower plate 152 and connected to the leads 198 with ceramic screws 194.

The entire assembly as shown in FIGS. 6 and 6B, with the exception of the sleeve 93 rotates at from 500 to 1500 rpm to minimize the thickness of the boundary layer above the surface 164, enabling the process gas to reach the wafer faster and the byproducts from the CVD process to escape more readily from the wafer surface 164. The flow is illustrated by the arrows 78 and 197 in FIG. 4. Such flow forms a stagnation point at the center 198 on the axis 37 as it intersects the surface 164 of the wafer 165. The lip 162 is provided with the surface 161 of a substantial upwardly facing area to serve as a scavenger, when made of a material on which tungsten nucleates and used in a blanket deposition process, for unused reactant gases such as tungsten hexafluoride, thereby minimizing the amount of tungsten hexafluoride being exhausted from the chamber 25. This lip 162 is removable and replaceable with a lip having an inwardly extending portion 167 having a different inside diameter to thereby accommodate wafers 165 of differing sizes.

Figure 6C:
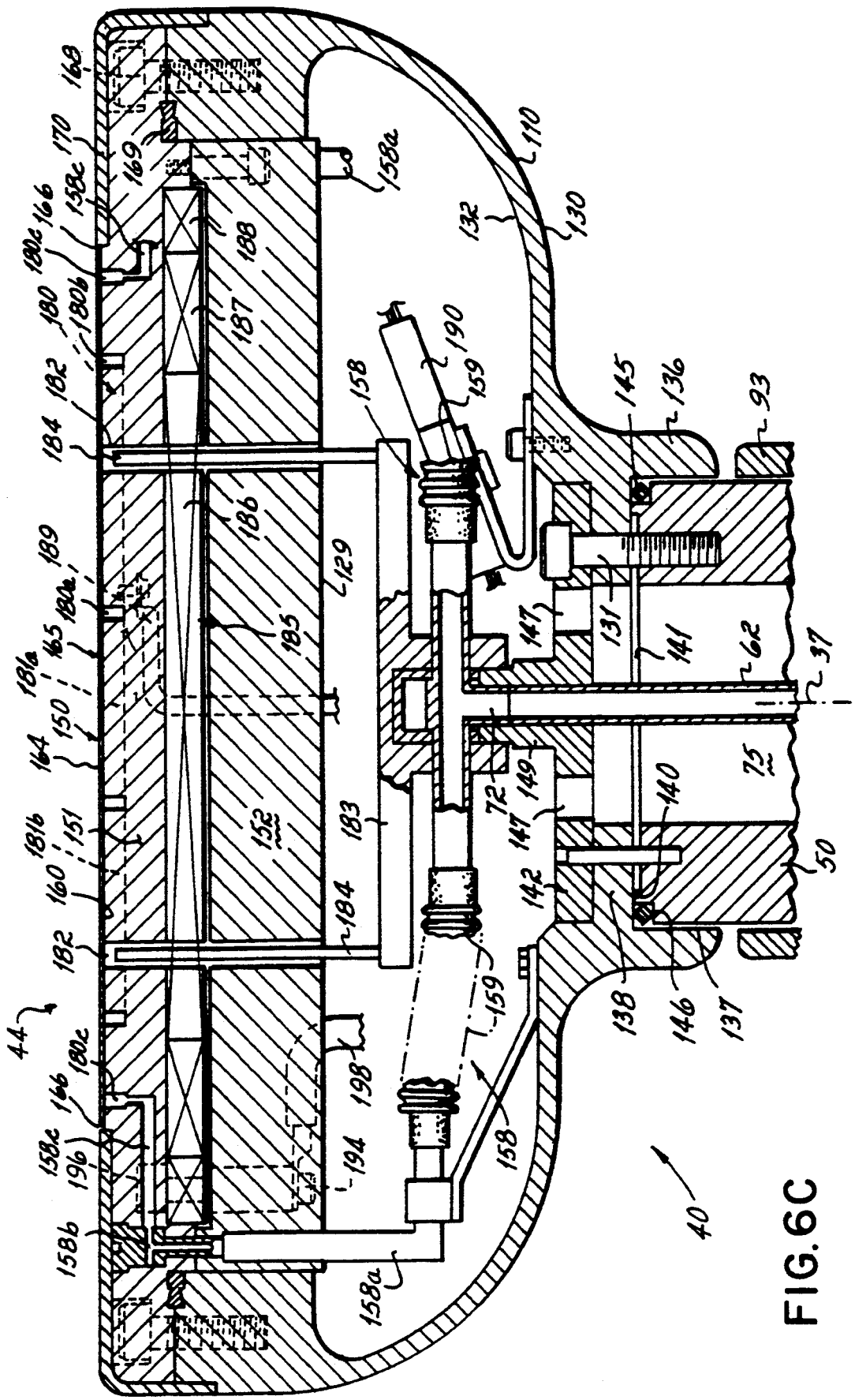
FIG. 6C is an enlarged cross-sectional view, similar to FIG. 6, of the susceptor of an alternative to the embodiment of FIG. 6B.
Figure 8:
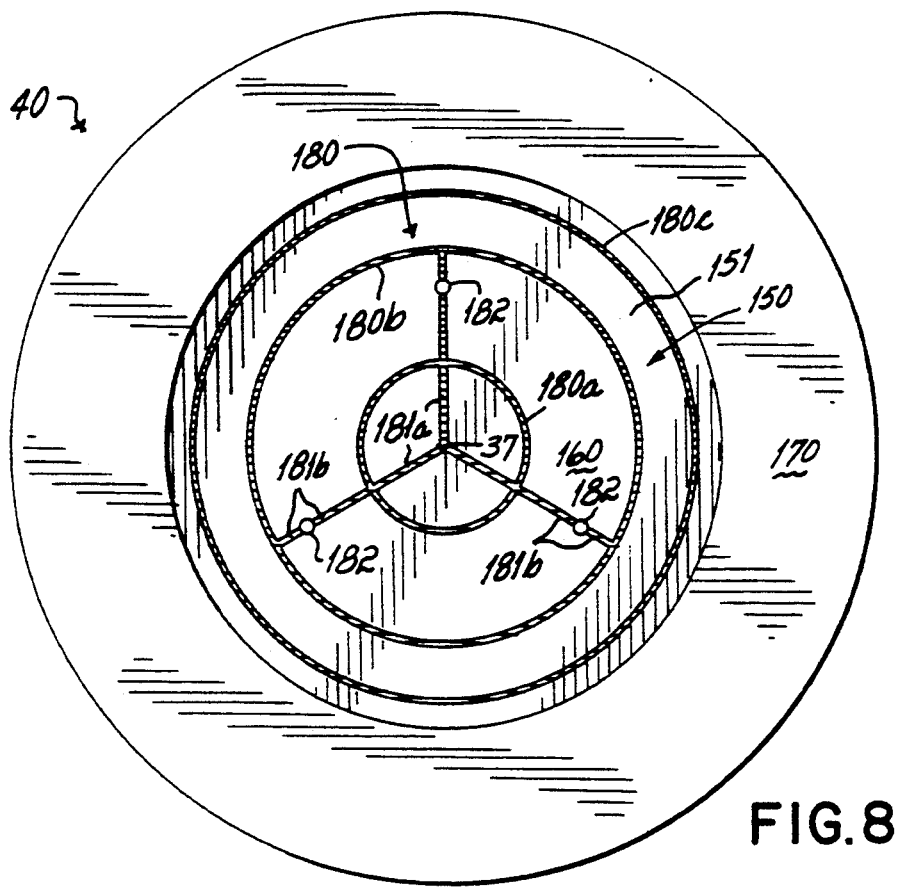
FIG. 8 is a top view of the susceptor of FIG. 6C, but with the wafer removed.

FIG. 6C illustrates a further alternative embodiment to the susceptor alternatives in FIGS. 6, 6B and 6C. The embodiment of FIG. 6C is similar in most respects to that of FIG. 6B, with some modifications, and also includes a modified form of the wafer edge purge feature of the embodiment of FIG. 6. As shown in FIG. 8, the embodiment of FIG. 6C includes the grooves 180a, 180b, 181a and 181b of FIG. 6B. However, the grooves 181c are eliminated, and the groove 180c functionally replaces the annular groove or channel 176 of FIG. 6, but at a position inboard of the edge or rim of the wafer 165. This groove 181c, in the embodiment of FIG. 6C, is connected to a separately regulated source of gas from the bore 72 of the tube 62 by the tubes 158, which respectively communicate through a pair of rigid tubes 158a with a respective pair of ports 158b, carried by bored plugs, with a respective pair of radially oriented ports 158c. This gas is supplied at a pressure of slightly greater than the pressure in the chamber 25, for example from approximately 0.5 to 1.0 Torr greater, which is lower than the pressure in the grooves 180a, 180b, 181a and 181b of typically 10 Torr. The gas may be an inert gas such as helium, or a reactive gas that will clean deposits from the CVD process that might form in the space 166 between the wafer 165 and the lip 162 or 170, such as $NF_3$ in the case where tungsten is being applied.

Additionally, optimal reactant gas flow on the surface of the wafer is achieved by varying the spacing between the gas showerhead 35 and the susceptor 40. Provision for this is made by addition of one or more spacer rings, such as spacer ring 199, between the top edge of the reactor housing 26 and the chamber cover 27 (FIG. 2).

The operation of the module 10 described above for the blanket and selective deposition of tungsten onto semiconductor silicon wafers is described in detail in the copending and commonly assigned patent application Robert F. Foster and Helen E. Rebenne entitled METHODS OF CHEMICAL VAPOR DEPOSITION (CVD) OF FILMS ON PATTERNED WAFER SUBSTRATES filed on even date herewith, hereby expressly incorporated herein by reference.

While the above described embodiments of the invention relate to processors of the CVD type, the rotating disk susceptor, gas flow, temperature maintenance and other features of the invention are useful in connection with other types of processes, especially where rapid and uniform transporting of vapor substances to and from the wafer surface is desired. For example, in connection with the deposition of titanium nitride films, a degassing process is preferably performed in a separate module prior to the TiN deposition. In such a process, water that has been absorbed into the wafer, as, for example, might have been absorbed into a phosphosilicate glass (PSG) or borophosphosilicate glass (BPSG) film deposited onto the wafer prior to the TiN process, is removed by heating the wafer. Also, subsequent to a TiN film deposition, chlorine may be removed by an annealing process in a separate module. In such processes, a separate dedicated processing module as described above may be used with, for example, argon or nitrogen gas in the performance of a preheating or degassing process, while another dedicated similar module may be used with, for example, ammonia in the performance of an annealing process. In both applications, such a module will function the same as the CVD module described above except that, instead of material being added to the substrate as is done in a CVD process, material is removed from the substrate. The benefits of the rotating disk and other features of the invention nonetheless apply to such processes. These benefits include a uniform boundary layer that is thinned by rotation of the susceptor, which in turn results in a faster water or chlorine removal rate and a more uniform removal rate across the surface of the wafer. Further, the radially outward flow of gas contributes to the flushing of the water, chlorine or other substance away from the surface of the wafer, enhancing the efficiency of the removal. This prevents desorbed material from being redeposited onto the surface of the wafer.

In applying principles of the invention to degas and anneal modules, not all of the structure desirable for CVD applications in the above described embodiments is necessary. For example, the RF cleaning electrodes 80 and 90 may be eliminated, as well as the power connections and supplies powering them. Further, only one baffle at the bottom of the chamber 25 is usually sufficient. The number of gas supplies and associated equipment may, of course, be limited to that needed for the application. Further, since such processes are basically heat treating processes, the chamber housing 26 is preferably insulated from the outside.

In order to achieve optimim processing uniformity with the rotating susceptor described in embodiments above, the process should be operated under conditions dictated by the rotation rate. In CVD applications, this optimization will achieve the highest deposition rate and reactant conversion without sacrificing film uniformity or properties. To produce these conditions, the total mass flow rate of gas flowing radially outward on the susceptor surface is matched by an equal mass flow rate of gas flowing along the axis from the showerhead toward and against the susceptor surface. The downward flow rate is furnished and controlled by the rate of injection of the inlet gas. If the inlet gas flow rate is too small, the susceptor becomes starved for fluid, while if the inlet gas flow rate is too high, fluid backs up near the susceptor surface. In either case, the velocity porfile will not be of the proper shape to give a uniform boundary layer thickness near the susceptor surface and hence the benefits of rotation will not be fully realized. At a given temperature, pressure, inlet gas composition, and susceptor rotation rate, one inlet gas flow rate or a narrow range of inlet gas flow rates gives optimum operation. This flow rate is commonly referred to as the "matched flow rate" for the given set of conditions. They may be determined theoretically or by experimentation for each process and each reactor, and preferably, first theoretically and then verified or fine tuned experimentally. For blanket and selective tungsten CVD, an inlet gas flow rate will fall generally within the range of from 0.5 slpm to 5.0 slpm for the temperatures, pressures, gas composition and rotational speeds discussed above. For example, for blanket tungsten deposition, 0.1 slpm of $WF_6$ and 2.0 slpm for $H_2$, for a total flow of 2.1 slpm, has been found preferable for 425° C., 80 Torr and 750 RPM. For selective tungsten CVD, 0.1 slpm of $SiH_4$, 0.15 slpm for $WF_6$ and 2.75 slpm for $H_2$, for a total flow of 3.0 slpm, has been found preferable for 280° C., 5 Torr, and 250 RPM. Generally, flow rate must be increased when temperature, rotational speed or viscosity are increased, or when pressure is decreased, when the other parameters are held constant.

While the above detailed description sets forth a preferred embodiment of the invention, it will be apparent to those skilled in the art that variations and modifications can be made without departing from the principles of the invention. The principles of the present invention include several concepts most useful for CVD, and useful for other wafer processing applications, particularly those in which material is to be transferred from a gas to a wafer, or from a wafer to a gas. Various details of the reactor of the described embodiments may be modified in design, and may be combined in the same structure. For example, the lower plasma electrode has been described and combined with structure constituting a baffle. Similarly, the upper plasma electrode, while provided in separate structure in the preferred embodiment, may be combined with or incorporated into the showerhead. Accordingly, the subject matter of the invention is intended to be limited only by the following claims:

What is claimed is:

1. A CVD reactor apparatus for coating semiconductor wafers comprising:
   a sealed vessel enclosing an interior volume, the vessel having exhaust means for maintaining the volume at a vacuum pressure level;
   a susceptor supported in a processing space in the interior volume of the vessel;
   means at one end of the volume for supplying at leas one reactant gas containing a substance of which the film is to be formed;
   means for directing a flow of reactant gas at sub-reaction temperature from the supplying means into the processing space and to the exhaust means in a smooth non-turbulent flow across the wafer, the directing means including a plurality of plasma generating electrodes within the processing space, the electrodes including surface means contoured to facilitate the smooth flow of gas within the processing space; and
   the electrodes include a circular array of cleaning gas outlets therein and spaced therearound for facilitating plasma cleaning of interior components of the vessel.

2. The apparatus of claim 1 wherein:
   the exhaust means includes a gas exhaust port in the vessel axially spaced more distant from the supplying means than from the wafer supporting surface of the susceptor; and
   baffle means surrounding the axis and axially positioned between the wafer supporting surface of the susceptor and the exhaust port for facilitating the exhausting of gas through the exhaust port without creating turbulence inside the processing space.

3. The apparatus of claim 2 wherein:
   the baffle means comprises a plurality of axially spaced baffles each defining an annular passage around the axis.

4. The apparatus of claim 1 wherein:
   the susceptor has an upwardly facing wafer supporting surface thereon; and
   the supplying means is downwardly facing for directing the flow of reactant gas downward from the supplying means into the processing space from above.

5. A CVD reactor apparatus for coating semiconductor wafers comprising:
   a sealed vessel enclosing an interior volume, the vessel having exhaust means for maintaining the volume at a vacuum pressure level;
   a susceptor supported in a processing space in the interior volume of the vessel, the susceptor having a wafer supporting surface thereon;
   means at one end of the volume for supplying at least one reactant gas containing a substance of which the film is to be formed;
   the exhaust means including a gas exhaust port int the vessel axially spaced more distant from the supplying means than form the wafer supporting surface of the susceptor;
   means for directing a flow of reactant gas at sub-reaction temperature from the supplying means into the processing space and to the exhaust means in a smooth non-turbulent flow across the wafer, the directing means including a plurality of plasma generating electrodes within the processing space, the electrodes including surface means contoured to facilitate the smooth flow of gas within the processing space;
   baffle means surrounding the axis and axially positioned between the wafer supporting surface of the susceptor and the exhaust port for facilitating the exhausting of gas through the exhaust port without creating turbulence inside the processing space; and
   the baffle means comprises a plurality of axially spaced baffles each defining an annular passage around the axis, the annular spaced passages having cross-sectional areas that decrease with their proximity to the exhaust port.

6. A CVD reactor apparatus for coating semiconductor wafers comprising:
   a sealed vessel enclosing an interior volume, the vessel having exhaust means for maintaining the volume at a vacuum pressure level;
   a susceptor supported in a processing space in the interior volume of the vessel;
   means at one end of the volume for supplying at leas one reactant gas containing a substance of which the film is to be formed;
   means for directing a flow of reactant gas at sub-reaction temperature from the supplying means into the processing space and to the exhaust means in a smooth non-turbulent flow across the wafer, the directing means including a plurality of plasma generating electrodes within the processing space, the electrodes including surface means contoured to facilitate the smooth flow of gas within the processing space; and
   the processing space being bounded by a vessel housing and the plurality of electrodes includes a first annular electrode surrounding an axis extending from the supplying means to the susceptor, the first annular electrode including conical surface means angled radially outward form the supplying means to the housing for minimizing turbulence in the processing space.

7. A CVD reactor apparatus for coating semiconductor wafers comprising:
   a sealed vessel enclosing an interior volume, the vessel having exhaust means for maintaining the volume at a vacuum pressure level;
   a susceptor supported in a processing space in the interior volume of the vessel;
   means at one end of the volume for supplying at leas one reactant gas containing a substance of which the film is to be formed;
   means for directing a flow of reactant gas at sub-reaction temperature from the supplying means into the processing space and to the exhaust means in a smooth non-turbulent flow across the wafer, the directing means including a plurality of plasma generating electrodes within the processing space, the electrodes including surface means contoured to facilitate the smooth flow of gas within the processing space;
   the exhaust means further comprising a gas exhaust port int the vessel axially spaced more distant from the supplying means than from the wafer supporting surface of the susceptor;

at least one annular baffle surrounding an axis through the susceptor an axially positioned between the wafer supporting surface of the susceptor and the exhaust port; and the plurality of electrodes including a first annular electrode and a second annular electrode, the second annular electrode being formed on the baffle.

8. The apparatus of claim 7 wherein:

the first annular electrode includes the supplying means.

9. A CVD reactor apparatus for applying tungsten film to semiconductor wafers comprising:

a sealed vessel enclosing an interior volume, the vessel having exhaust means for maintaining the volume at a vacuum pressure level;

a susceptor supported in a processing space in the interior volume of the vessel, the susceptor having a wafer supporting surface thereon;

means at one end of the volume for supplying at leas one reactant gas containing a substance of which the film is to be formed;

the exhaust means including a gas exhaust port int the vessel axially spaced more distant from the supplying means than from the wafer supporting surface of the susceptor;

means for directing a flow of reactant gas at sub-reaction temperature from the supplying means into the processing space and to the exhaust means in a smooth non-turbulent flow across the wafer, the directing means including a plurality of plasma generating electrodes within the processing space, the electrodes including surface means contoured to facilitate the smooth flow of gas within the processing space;

the supplying means including a mixing chamber and cooling means for maintaining gases therein at a controlled sub-reaction temperature;

the supplying means including a source of tungsten hexafluoride reactant gas, a source of reducing reactant gas, and means for supplying reducing reactant gas to the reaction space;

the supplying means being horizontally disposed;

the susceptor including heating means for heating the wafer held to the supporting surface to a reaction temperature effective to cause the reactant gases to react and deposit a tungsten film on the wafer; 'the plurality of plasma generating electrodes within the processing space having cleaning gas outlets therein; and a source of $NF_3$ gas and connected thereto for supplying $NF_3$ gas from the source thereof tot he outlets.

* * * * *